US012275888B2

(12) United States Patent
Yamazaki et al.

(10) Patent No.: US 12,275,888 B2
(45) Date of Patent: Apr. 15, 2025

(54) AGGLOMERATED BORON NITRIDE POWDER, HEAT DISSIPATION SHEET, AND SEMICONDUCTOR DEVICE

(71) Applicant: Mitsubishi Chemical Corporation, Tokyo (JP)

(72) Inventors: Masanori Yamazaki, Tokyo (JP); Masaya Sugiyama, Tokyo (JP); Naoyuki Komuro, Tokyo (JP); Hiromu Watanabe, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 720 days.

(21) Appl. No.: 17/444,201

(22) Filed: Aug. 2, 2021

(65) Prior Publication Data

US 2021/0363399 A1 Nov. 25, 2021

Related U.S. Application Data

(63) Continuation of application No. PCT/JP2020/007124, filed on Feb. 21, 2020.

(30) Foreign Application Priority Data

Feb. 27, 2019 (JP) .................. 2019-034518

(51) Int. Cl.
*C09K 5/14* (2006.01)
*C01B 21/064* (2006.01)
*C08J 5/18* (2006.01)
*C08K 3/38* (2006.01)
*H01L 23/373* (2006.01)

(52) U.S. Cl.
CPC .............. *C09K 5/14* (2013.01); *C01B 21/064* (2013.01); *C08J 5/18* (2013.01); *C08K 3/38* (2013.01); *H01L 23/373* (2013.01); *C01P 2004/50* (2013.01); *C01P 2004/61* (2013.01); *C01P 2006/11* (2013.01); *C01P 2006/32* (2013.01); *C08J 2363/02* (2013.01); *C08K 2003/385* (2013.01); *C08K 2201/001* (2013.01); *C08K 2201/003* (2013.01)

(58) Field of Classification Search
CPC ..... C09K 5/14; C01B 21/064; C01P 2004/50; C01P 2004/61; C01P 2006/11; C01P 2006/32; C08J 5/18; C08J 2363/02; C08K 5/18; C08K 2003/385; C08K 3/38; C08K 2201/001; C08K 2201/003; H01L 23/373
See application file for complete search history.

(56) References Cited

U.S. PATENT DOCUMENTS

| | | | | |
|---|---|---|---|---|
| 8,169,767 B2 * | 5/2012 | Pruss | ................. | C01B 21/0648 361/748 |
| 8,679,429 B2 | 3/2014 | Gohara et al. | | |
| 9,656,868 B2 | 5/2017 | Nishi et al. | | |
| 9,822,294 B2 | 11/2017 | Yamazaki et al. | | |
| 10,106,413 B2 | 10/2018 | Ikemiya et al. | | |
| 10,414,653 B2 | 9/2019 | Ikemiya et al. | | |
| 2001/0021740 A1 * | 9/2001 | Lodyga | ..................... | C08K 9/08 524/428 |
| 2006/0121068 A1 * | 6/2006 | Sane | ................... | C04B 35/6263 424/400 |
| 2006/0127422 A1 | 6/2006 | Lodyga et al. | | |
| 2007/0241303 A1 | 10/2007 | Zhong et al. | | |
| 2012/0058342 A1 * | 3/2012 | Lodyga | ..................... | C08K 9/08 428/402 |
| 2012/0196128 A1 | 8/2012 | Gohara et al. | | |
| 2014/0349105 A1 | 11/2014 | Yamazaki et al. | | |
| 2016/0060112 A1 | 3/2016 | Nishi et al. | | |
| 2016/0340191 A1 | 11/2016 | Ikemiya et al. | | |
| 2017/0335160 A1 | 11/2017 | Yamazaki et al. | | |
| 2018/0354793 A1 | 12/2018 | Ikemiya et al. | | |
| 2019/0352180 A1 | 11/2019 | Daiki et al. | | |

FOREIGN PATENT DOCUMENTS

| | | | | |
|---|---|---|---|---|
| CN | 102574684 A | 7/2012 | | |
| CN | 103958400 A | 7/2014 | | |
| CN | 105026312 A | 11/2015 | | |
| CN | 106029561 A | 10/2016 | | |
| EP | 2 786 961 A1 | 10/2014 | | |
| EP | 3 103 766 A1 | 12/2016 | | |
| JP | H1160215 A * | 3/1999 | .......... | C01B 21/064 |
| JP | 2008510878 A * | 4/2008 | .............. | C08K 3/38 |
| JP | 2011-098882 A | 5/2011 | | |
| JP | 2017-036190 A | 2/2017 | | |

(Continued)

OTHER PUBLICATIONS

International Search Report issued Apr. 7, 2020 in PCT/JP2020/007124 filed on Feb. 21, 2020, 2 pages.

Extended European Search Report issued Mar. 23, 2022 in European Patent Application No. 20762346.3, 8 pages.

Combined Chinese Notice of Reasons for Refusal and Search Report issued May 31, 2023 in Chinese Application No. 202080013457X, (with unedited computer-generated English translation of the Office Action and English translation of category of cited documents) 12 pages.

(Continued)

*Primary Examiner* — Jane L Stanley

(74) *Attorney, Agent, or Firm* — Oblon, McClelland, Maier & Neustadt, L.L.P.

(57) ABSTRACT

An agglomerated boron nitride powder, including a tap density of 0.6 g/ml or more and less than 0.8 g/ml and an interparticle void volume of 0.5 ml/g or more. A heat dissipation sheet, including the agglomerated boron nitride powder. An agglomerated boron nitride powder that enables a heat dissipation sheet to have improved thermal conductivity and good withstand voltage characteristics, a heat dissipation sheet containing the agglomerated boron nitride powder, and a semiconductor device including the heat dissipation sheet are provided.

20 Claims, No Drawings

(56) References Cited

FOREIGN PATENT DOCUMENTS

| JP | 2017-082091 | A | | 5/2017 | | |
|----|----|----|----|----|----|----|
| JP | 2018-020932 | A | | 2/2018 | | |
| WO | WO-03013845 | A1 | * | 2/2003 | ........... | C01B 21/064 |
| WO | WO 2012/070289 | A1 | | 5/2012 | | |
| WO | WO-2014136959 | A1 | * | 9/2014 | ........... | C01B 21/064 |
| WO | WO 2016/092952 | A1 | | 6/2016 | | |
| WO | WO 2018/123571 | A1 | | 7/2018 | | |

OTHER PUBLICATIONS

Combined Taiwanese Office Action and Search Report issued Jul. 17, 2023 in Taiwanese Patent Application No. 109106433 (with unedited computer-generated English Translation of Office Action only), 12 pages.
Chinese Office Action issued on Sep. 27, 2023 in Chinese Patent Application No. 202080013457 (with English translation), 7 pages.
Chinese Office Action issued Jan. 25, 2024 in Chinese Patent Application No. 202080013457.X (with unedited computer-generated English Translation), 10 pages.
Japanese Office Action issued Mar. 19, 2024 in Japanese Patent Application No. 2021-502200 (with unedited computer-generated English Translation), 11 pages.
Office Action issued Sep. 9, 2024, in corresponding Chinese Patent Application No. 202080013457.X (with English Translation), 10 pages.
Office Action issued Dec. 2, 2024, in corresponding Korean Patent Application No. 10-2021-7025712 (with Machine Translation), 13 pages.

* cited by examiner

AGGLOMERATED BORON NITRIDE POWDER, HEAT DISSIPATION SHEET, AND SEMICONDUCTOR DEVICE

CROSS-REFERENCE TO RELATED APPLICATIONS

The present application is the bypass continuation of international application PCT/JP2020/007124, filed on Feb. 21, 2020, and claims the benefit of the filing date of Japanese Appl. No. 2019-034518, filed on Feb. 27, 2019, the content of each of which is incorporated by reference.

TECHNICAL FIELD

The present invention relates to an agglomerated boron nitride powder suitably used for a heat dissipation sheet for a semiconductor device, a heat dissipation sheet including the agglomerated boron nitride powder, and a semiconductor device including the heat dissipation sheet.

BACKGROUND ART

Boron nitride (BN) is an insulating ceramic material and is known to have various crystal forms, such as c-BN having a diamond structure, h-BN having a graphite structure, and α-BN and β-BN having turbostratic structures.

Among these, h-BN, which has the same layered structure as graphite, is widely used in the fields of electrical and electronic materials because it is relatively easily synthesized and is excellent in thermal conductivity, solid lubricity, chemical stability, and heat resistance.

There has recently been a major problem of heat generation due to the increasing density of integrated circuits, especially in the electrical and electronics fields, and how to dissipate heat has been an urgent issue. Despite its insulating properties, h-BN has been attracting attention as a heat conductive filler for heat-dissipating members, taking advantage of its high thermal conductivity.

h-BN has a plate-like particle shape and a high thermal conductivity (usually, a thermal conductivity of about 400 W/m·K) in the planar direction of the plate (in the ab plane or (002) plane); however, h-BN has a low thermal conductivity (usually, a thermal conductivity of about 2 to 3 W/m·K) in the thickness direction (C-axis direction). For this reason, in the case where h-BN is mixed with a resin to prepare a BN particle-containing resin composition and where, for example, a plate-like sheet-shaped molded body is formed, the plate-like h-BN is aligned in the planar direction of the sheet-shaped molded body, which is a flow direction of the BN particle-containing resin composition during the molding. The resulting sheet-shaped molded body is excellent in thermal conductivity in the planar direction but has a low thermal conductivity in the thickness direction.

To improve the anisotropic thermal conductivity of the h-BN particles, agglomerated particles of h-BN having a shape other than a flake-like shape and having less orientation as described above when filled into a resin have been studied.

Patent Literature 1 describes agglomerated BN particles having a purity of 93% and a porosity (voidage) of 50% or less by volume. Patent Literature 1 does not describe the tap density. When the agglomerated BN particles are used in heat dissipation sheets for semiconductor devices, the thermal conductivity and the withstand voltage are still insufficient.

Patent Literature 2 describes agglomerated BN particles having a voidage of 50% to 70% by volume and a crushing strength of 1.0 to 4.0 MPa. Patent Literature 2 does not describe the tap density. The thermal conductivity and the withstand voltage when the agglomerated BN particles are used in heat dissipation sheets for semiconductor devices are still insufficient.

Patent Literature 3 describes agglomerated BN particles having an agglomerate size ($D_{50}$) of 2 to 200 µm and a tap density of 0.5 to 1.0 g/ml. Patent Literature 3 does not describe the orientation of primary particles constituting the agglomerated particles or the interparticle void volume affected by the shape of the agglomerated particles. The thermal conductivity and the withstand voltage by relative evaluation when the agglomerated BN particles are used in heat dissipation sheets for semiconductor devices are insufficient.

CITATION LIST

Patent Literature

PTL 1: International Publication No. 2012/070289
PTL 2: JP2017-82091A
PTL 3: JP2011-98882A

SUMMARY OF INVENTION

The present invention aims to provide an agglomerated boron nitride powder that enables a heat dissipation sheet to have improved thermal conductivity and good withstand voltage characteristics, a heat dissipation sheet containing the agglomerated boron nitride powder, and a semiconductor device including the heat dissipation sheet.

Solution to Problem

The inventors have found that an agglomerated boron nitride powder having a tap density and an interparticle void volume within specific ranges enables a heat dissipation sheet containing the agglomerated boron nitride powder to have a high thermal conductivity and good withstand voltage characteristics.

That is, the gist of the present invention will be described below.

[1] An agglomerated boron nitride powder, comprising a tap density of 0.6 g/ml or more and less than 0.8 g/ml and an interparticle void volume of 0.5 ml/g or more.
[2] The agglomerated boron nitride powder according to [1], wherein the interparticle void volume is 0.9 g/ml or less.
[3] The agglomerated boron nitride powder according to [1] or [2], wherein the agglomerated boron nitride powder has an average particle size of 20 µm or more and 200 µm or less.
[4] The agglomerated boron nitride powder according to any one of [1] to [3], wherein agglomerated BN particles contained in the agglomerated boron nitride powder have an intraparticle voidage of 40% or more and 60% or less.
[5] The agglomerated boron nitride powder according to any one of [1] to [4], wherein the agglomerated boron nitride powder has a card-house structure.
[6] A heat dissipation sheet, comprising the agglomerated boron nitride powder according to any one of [1] to [5].
[7] A semiconductor device, comprising the heat dissipation sheet according to [6].

Advantageous Effects of Invention

According to an agglomerated boron nitride powder of the present invention, it is possible to provide a heat dissipation sheet excellent in thermal conductivity and withstand voltage characteristics. The heat dissipation sheet containing the agglomerated boron nitride powder of the present invention can be used to provide a high-quality, high-reliability power semiconductor module having good heat dissipation performance and excellent thermal conductivity.

DESCRIPTION OF EMBODIMENTS

Embodiments of the present invention will now be described in detail, but the present invention is not limited to the following embodiments and can be practiced with various modifications within the scope of the gist of the invention.

[Agglomerated Boron Nitride Powder]

An agglomerated boron nitride powder of the present invention (hereinafter, also referred to simply as an "agglomerated BN powder of the present invention") is characterized by having a tap density of 0.6 g/ml or more and less than 0.8 g/ml and an interparticle void volume of 0.5 ml/g or more.

The agglomerated boron nitride powder in the present invention refers to a powder composed of a collection of agglomerated boron nitride particles (hereinafter, also referred to simply as "agglomerated BN particles").

[Mechanism]

Although the details of the mechanism by which the agglomerated BN powder of the present invention can be used to provide a heat dissipation sheet excellent in thermal conductivity and withstand voltage characteristics are not clear, they are estimated below.

A tap density of less than 0.6 g/ml tend to result in a high interparticle voidage (interparticle void volume) of particles in the agglomerated BN powder. An excessively large interparticle voidage results in a high probability of the formation of a resin-unfilled region. When a resin sheet containing the agglomerated BN powder is produced and then a voltage is applied thereto, a current leaks in the resin-unfilled region to deteriorate the withstand voltage characteristics.

A tap density of 0.8 g/ml or more results in a low interparticle voidage of the particles in the agglomerated BN powder. An excessively low interparticle voidage results in a difficulty in filling the voids with the resin. Thus, fine voids tend to remain in the agglomerated BN powder. When a resin sheet containing the agglomerated BN powder is produced and then a voltage is applied thereto, a current leaks in these resin-unfilled regions to deteriorate the withstand voltage characteristics.

In the present invention, the tap density is also associated with the growth and growth mode of the primary BN particles included in the agglomerated BN particles, and is a concept also including the amount of closed pores in the agglomerated BN particles, which cannot be expressed by porosity.

When the agglomerated BN powder having an interparticle void volume of less than 0.5 ml/g is used to form a resin sheet containing the agglomerated BN powder, the amount of the resin component is large with respect to the interparticle void volume, leading to a difficulty in eliminating voids left in the resin. Thus, the application of a voltage to the resulting resin sheet causes the leakage of a current to occur at the void portions, thereby deteriorating the withstand voltage characteristics.

The present invention has been accomplished by considering the tap density of the agglomerated BN powder as a comprehensive index of the physical properties, such as the voidage, the particle size distribution, the shape of particles, the strength of the particles, the size of the primary particles, and the amount of closed pores, of the agglomerated BN particles and finding that the use of an agglomerated BN powder having a tap density of 0.6 g/ml or more and less than 0.8 g/ml, which is a very narrow range, and an interparticle void volume of 0.5 ml/g or more for the formation of a heat dissipation sheet results in the heat dissipation sheet excellent in thermal conductivity and withstand voltage characteristics.

The tap density in the present invention is the density of a powder that has been tapped and filled into a measurement container, the density being measured by a method described in Examples below. Although this tap density may seem to be related to the voidage of the agglomerated particles described in Patent Literatures 1 and 2, the tap density varies depending not only on the voidage of the agglomerated particles but also on the particle size distribution, the particle shape, the particle strength, the primary particle size, the amount of closed pores, and so forth.

The interparticle void volume in the present invention represents an accumulated volume at a pore size of particles of 2 μm or more (threshold size) in mercury intrusion measurement, i.e., the amount of voids among the particles when the particles are filled. The interparticle void volume is measured by a method described in Examples below.

A method for collecting a measurement powder from the agglomerated BN powder is not particularly limited. Preferably, the agglomerated BN powder is uniformly mixed before collecting the measurement powder.

[Agglomerated BN Powder]

The agglomerated BN powder of the present invention is a collection of agglomerated BN particles formed by agglomeration of primary BN particles, preferably primary h-BN particles, and may contain a component other than the agglomerated BN particles as long as the effects of the present invention are not impaired. Examples of the component other than the primary h-BN particles include components originating from binders, surfactants, and solvents that may be added to a slurry and that will be described in [Method for Manufacturing Agglomerated BN Powder] below.

<Shape of Agglomerated BN Particles in Agglomerated BN Powder>

The shape of the agglomerated BN particles in the agglomerated BN powder of the present invention is not particularly limited. For example, these agglomerated particles may have any shape, such as spherical, ellipsoidal, cylindrical, or hexagonal shape, that can be produced by agglomerating the primary BN particles.

To provide high thermal conductivity, in particular, card house-type agglomerated BN particles having a card-house structure are preferred. The card-house structure is a structure described, for example, in Ceramics, 43 No. 2 (2008, published by The Ceramic Society of Japan) and formed by plate-like particles stacked intricately without orientation. More specifically, the agglomerated BN particles having the card-house structure are agglomerated BN particles that are formed of a collection of primary BN particles and that have a structure in which a planar portion of each of the primary BN particles is in contact with an end face portion of another primary particle. Each of the agglomerated BN particles is preferably spherical.

Each agglomerated BN particle preferably has the same structure as the card-house structure even inside the particle. The agglomerated form and the internal structure of each agglomerated BN particle can be observed with a scanning electron microscope (SEM).

<Physical Properties of Agglomerated BN Powder>
<<Tap Density>>

The agglomerated BN powder of the present invention is characterized by having a tap density of 0.6 g/ml or more and less than 0.8 g/ml.

When the tap density is outside the range of 0.6 g/ml or more and less than 0.8 g/ml, improvements in thermal conductivity and withstand voltage characteristics, which are the objects of the present invention, cannot be achieved.

The agglomerated BN powder of the present invention has a tap density of 0.6 g/ml or more, preferably 0.61 g/ml or more, more preferably 0.63 g/ml or more, even more preferably 0.65 g/ml or more, and less than 0.8 g/ml, preferably 0.79 g/ml or less, more preferably 0.78 g/ml. Moreover, the agglomerated BN powder has a tap density of 0.6 g/ml or more and less than 0.8 g/ml, preferably 0.61 g/ml to 0.79 g/ml, more preferably 0.63 to 0.78 g/ml. When the tap density is within the above range, the thermal conductivity and the withstand voltage characteristics tend to be further improved.

<<Interparticle Void Volume>>

The agglomerated BN powder of the present invention is characterized by having an interparticle void volume of 0.5 ml/g or more. When the interparticle void volume is more than or equal to the lower limit, improvements in thermal conductivity and withstand voltage characteristics are obtained.

The agglomerated BN powder of the present invention has an interparticle void volume of 0.5 ml/g or more, preferably 0.55 ml/g or more, more preferably 0.58 ml/g or more, even more preferably 0.6 ml/g or more, and preferably 0.9 ml/g or less, more preferably 0.8 ml/g or less. In the case where the interparticle void volume is within the above range, the appropriate amount of a resin among the agglomerated BN particles when the agglomerated BN particles are used for a sheet is appropriate, and the gaps (voids) in the sheet are reduced; thus, the thermal conductivity and the withstand voltage characteristics tend to be improved.

<<Volume-Average Particle Size ($D_{50}$)>>

The volume-average particle size ($D_{50}$) of the agglomerated BN powder of the present invention is not particularly limited, but is preferably 20 μm or more, more preferably 25 μm or more, even more preferably 26 μm or more, particularly preferably 30 μm or more, most preferably 40 μm or more. The agglomerated BN powder preferably has a volume-average particle size ($D_{50}$) of 200 μm or less, more preferably 150 μm or less, even more preferably 100 μm or less, particularly preferably 80 μm or less. In the case where $D_{50}$ of the agglomerated BN powder is more than or equal to the lower limit described above, the contact resistance between the agglomerated BN particles is reduced when the agglomerated BN particles are used for a heat dissipation sheet, and the agglomerated BN powder itself tends to have increased thermal conductivity, for example. In the case where $D_{50}$ of the agglomerated BN powder is less than or equal to the upper limit, when the agglomerated BN particles are used for a heat dissipation sheet, for example, the heat dissipation sheet has improved surface smoothness and appropriate gaps between the agglomerated BN particles; thus, the thermal conductivity tends to be improved.

The volume-average particle size ($D_{50}$) of the agglomerated BN powder refers to a particle size at a cumulative volume of exactly 50% in a cumulative curve drawn with respect to 100% of the volume of the powder used in the measurement. An example of a method for measuring $D_{50}$ is a wet measurement method in which the measurement is performed on a sample of the agglomerated BN powder dispersed in a deionized water medium containing sodium hexametaphosphate serving as a dispersion stabilizer with, for example, a laser diffraction/scattering particle size distribution analyzer. Another example thereof is a dry measurement method in which the measurement is performed with "Morphologi" available from Malvern.

<<Intraparticle Voidage>>

The intraparticle voidage of the agglomerated BN particles contained in the agglomerated BN powder of the present invention is not particularly limited, but is preferably 40% or more, more preferably 45% or more, and preferably 60% or less, more preferably 55% or less. When the intraparticle voidage is within the above range, a heat dissipation sheet having excellent withstand voltage characteristics tend to be stably produced.

The intraparticle voidage of the agglomerated BN particles is measured as follows: The powder density, the total pore volume, and the interparticle void volume are measured with a mercury porosimeter. The intraparticle pore volume is determined by subtracting the interparticle void volume from the total pore volume. The percentage of the intraparticle pore volume with respect to the powder volume (1/powder density) is defined as the intraparticle voidage.

<<Average Circularity>>

The average circularity of the agglomerated BN powder of the present invention is not particularly limited, but is preferably 0.8 or more, more preferably 0.85 or more. The upper limit of the average circularity is not particularly limited and may be 1. When the average circularity is within the above range, the interparticle void volume is in an appropriate range; thus, the effects of the present invention tend to be provided.

The average circularity of the agglomerated BN powder is determined by dispersing the agglomerated BN powder with a pressure-pulse sample dispersing unit and performing image analysis with Morphologi G3S available from Malvern.

<<Compressive Fracture Strength>>

The compressive fracture strength of the agglomerated BN powder of the present invention is not particularly limited, but is preferably 20 MPa or less, more preferably 15 MPa or less, even more preferably 10 MPa or less, particularly preferably 9 MPa or less. The compressive fracture strength is preferably 1 MPa or more, more preferably 2 MPa or more, even more preferably 3 MPa or more. When the compressive fracture strength is within the above range, the agglomerated BN powder can deform moderately; thus, when a heat dissipation sheet is produced, the heat dissipation sheet tends to have improved thermal conductivity.

The compressive fracture strength of the agglomerated BN powder is measured at room temperature (20° C. to 30° C.) with an MCT-510 micro compression testing machine available from Shimadzu Corporation at a test force of 98 mN and a loading rate of 4.84 mN/sec using a top compression indenter having a flat surface with a diameter of 100 μm. One agglomerated BN particle having a particle size of about 50 μm is selected. The test is performed five times. The compressive fracture strength is determined by the average of the five measurement results. The compressive fracture strength is calculated from the following formula:

$$Cs = 2.48/\pi d^2$$

where Cs: compressive fracture strength (MPa),
P: fracture test force (N), and
d: particle size (mm).

<<Elastic Modulus>>

The elastic modulus of the agglomerated BN powder of the present invention is not particularly limited, but is preferably 40 MPa or more, more preferably 45 MPa or more, even more preferably 50 MPa or more. The elastic modulus is preferably 100 MPa or less, more preferably 90 MPa or more. When the elastic modulus is within the above range, the agglomerated BN particles can deform moderately; thus, when a heat dissipation sheet is produced, the heat dissipation sheet tends to have improved thermal conductivity.

The elastic modulus of the agglomerated BN powder is calculated from the following formula using the test force (N), the compressive displacement (mm), and the particle size (mm) obtained from a compression test of the agglomerated BN particles (a compression test with a micro compression testing machine available from Shimadzu Corporation, measured at room temperature (20° C. to 30° C.) with reference to Bussei Kenkyu (Research on Physical Properties), Yoshimi Tanaka, 85(4), 499-518, 2006:

$$E = 3 \times (1-v^2) \times P/4 \times (d/2)^{1/2} \times Y^{3/2}$$

where v: Poisson's ratio (Poisson's ratio was set to 0.13),
P: test force (N),
d: particle size (mm), and
Y: compressive displacement (mm).

[Method for Manufacturing Agglomerated BN Powder]

A method for manufacturing an agglomerated BN powder of the present invention is not particularly limited. In particular, preferably, boron nitride serving as a raw material (hereinafter, this boron nitride and the pulverized product thereof are also referred to as a "raw-material BN powder") is pulverized in a pulverization step, granulated by agglomeration in a granulation step, and heat-treated in a heating step. More specifically, preferably, the raw-material BN powder is dispersed in a medium to prepare a slurry of the raw-material BN powder (hereinafter, also referred to as a "BN slurry"), the slurry is subjected to pulverization treatment, the resulting slurry is granulated into spherical particles, and the resulting granulated BN powder is subjected to heat treatment for crystallization.

<Raw-material BN Powder>

As the raw-material BN powder, for example, commercially available h-BN, commercially available α- and β-BN, BN prepared from a boron compound and ammonia by a reduction-nitridation method, or BN synthesized from a boron compound and a nitrogen-containing compound, such as melamine, can be used without restriction. As the raw-material BN powder, h-BN is particularly preferably used because the effects of the present invention are more effectively provided.

A suitable form of the raw-material BN powder is low-crystallinity powder-like BN particles that exhibit a peak having a large half-width obtained by powder X-ray diffraction measurement. That is, while it is possible to use plate-like h-BN as a raw material, nanoparticles that do not have a plate-like shape are also suitably used. As a guide for the crystallinity, the half-width of a peak from the (002) plane obtained by powder X-ray diffraction measurement is usually 0.4° or more, preferably 0.45° or more, more preferably 0.5° or more in terms of angle 2θ. The half-width of the peak from the (002) plane is usually 2.0° or less, preferably 1.5° or less, more preferably 1° or less. When the half-width of the peak from the (002) plane is less than or equal to the upper limit described above, the crystallites grow easily; thus, the productivity tends to be sufficiently improved. When the half-width of the peak from the (002) plane is more than or equal to the lower limit, the crystallinity is within an appropriate range; thus, the crystals grow easily, and the dispersion stability during slurry production tends to be improved.

A method for manufacturing the raw-material BN powder is not particularly limited. An example thereof is a method described, for example, in Microstructural development with crystallization of hexagonal boron nitride (TSUYOSHI etc., JOURNAL OF MATERIALS SCIENCE LETTERS 16 (1997) 795-798).

From the viewpoint of the growth of BN crystals, oxygen atoms are preferably present in the raw-material BN powder to some extent. In the present invention, the raw-material BN powder preferably has a total oxygen concentration of 1% or more by weight, more preferably 2% or more by weight, even more preferably 3% or more by weight, particularly preferably 4% or more by weight, and preferably 10% or less by weight, more preferably 9% or less by weight. When the total oxygen concentration is less than or equal to the upper limit described above, residual oxygen after heat treatment is reduced; thus, the effect of improving the thermal conductivity tends to be enhanced. When the total oxygen concentration is more than or equal to the lower limit described above, the crystallinity is not too excessive, and the crystals tends to grow.

Examples of a method for adjusting the total oxygen concentration in the raw-material BN powder to the above range include a method in which BN is synthesized at a low synthesis temperature of 1,500° C. or lower and a method in which the raw-material BN powder is heat-treated in an oxidizing atmosphere at a low temperature of 500° C. to 900° C.

The total oxygen concentration in the raw-material BN powder can be measured by an inert gas fusion-infrared absorption method using an oxygen/nitrogen analyzer available from Horiba, Ltd.

The raw-material BN powder preferably has a total pore volume of 1.5 cm$^3$/g or less. When the total pore volume is 1.5 cm$^3$/g or less, the raw-material BN powder is dense, thus enabling granulation at high sphericity. The lower limit of the total pore volume is preferably, but not particularly limited to, 0.3 cm$^3$/g or more, more preferably 0.5 cm$^3$/g or more.

The raw-material BN powder preferably has a specific surface area of 50 m$^2$/g or more, more preferably 60 m$^2$/g or more, even more preferably 70 m$^2$/g or more, and preferably 1,000 m$^2$/g or less, more preferably 500 m$^2$/g or less, even more preferably 300 m$^2$/g or less. When the raw-material BN powder has a specific surface area of 50 m$^2$/g or more, the BN slurry used for the formation of spherical particles through granulation, can have a small dispersed particle size, which is preferred. When the raw-material BN powder has a specific surface area of 1,000 m$^2$/g or less, an increase in the viscosity of the slurry can be suppressed, which is preferred.

The total pore volume of the raw-material BN powder can be measured by a nitrogen adsorption method and a mercury intrusion method.

The specific surface area of the raw-material BN powder can be measured by a BET single-point method (adsorption gas: nitrogen). The nitrogen adsorption method is performed by a method according to JIS Z8830, and the measurement temperature is −196° C. (liquid nitrogen temperature). The mercury intrusion method is performed by a method according to JIS R1655. The surface tension of BN is 485 dyn/cm$^2$, the contact angle is 140°, and the measurement temperature is 23° C. to 26° C.

<Medium>

The medium used for the preparation of the BN slurry is not particularly limited, and water and/or any of various organic solvents can be used. In view of the ease of spray drying, the simplification of a device, and so forth, the medium used is preferably water, more preferably deionized water.

The medium used for the preparation of the BN slurry is preferably added in an amount such that the BN slurry has a viscosity of 200 to 5,000 mPa·s. The viscosity of the BN slurry indicates the viscosity at a slurry temperature of 10° C. or higher and 60° C. or lower. The above viscosity is preferably obtained at 15° C. or higher and 50° C. or lower, more preferably 15° C. or higher and 40° C. or lower, more preferably 15° C. or higher and 35° C. or lower.

Specifically, the amount of the medium used for the preparation of the BN slurry is preferably 10% or more by weight, more preferably 20% or more by weight, even more preferably 30% or more by weight, and preferably 70% or less by weight, more preferably 65% or less by weight, even more preferably 60% or less by weight, based on the BN slurry. When the amount of the medium used is less than or equal to the upper limit described above, the slurry viscosity is not excessively low, and settling and so forth are suppressed, so that the BN slurry tends to have good uniformity. Thus, the tap density of the resulting agglomerated BN particles tend to be in the desired range. When the amount of the medium used is more than or equal to the lower limit, the slurry viscosity is not excessively high; thus, the granulation tends to be easy.

<Surfactant>

Various surfactants may be added to the BN slurry from the viewpoints of adjusting the viscosity of the slurry and achieving good dispersion stability (suppression of aggregation) of the raw-material BN powder in the slurry.

Examples of the surfactant that can be used include anionic surfactants, cationic surfactants, and nonionic surfactants. These may be used alone or in combination as a mixture of two or more.

Typically, surfactants can change the viscosity of the slurry. Accordingly, when a surfactant is added to the BN slurry, the amount of the surfactant added is adjusted to an amount such that the BN slurry has a viscosity of 200 to 5,000 mPa·s. The viscosity of the BN slurry indicates the viscosity in the temperature range described in the section "Medium" used for the preparation of the BN slurry.

For example, when a slurry having a solid content of 50% by weight is prepared using, as raw-material BN, BN that has a total oxygen concentration of 7.5% by weight and exhibits a half-width 2θ of the peak from the (002) plane of 0.67° obtained by powder X-ray diffraction measurement, usually, an anionic surfactant is added, as an effective component, in an amount of preferably 0.01% or more by weight, more preferably 0.05% or more by weight, even more preferably 0.1% or more by weight, and preferably 10% or less by weight, more preferably 7% or less by weight, even more preferably 5% or less by weight, particularly preferably 3% or less by weight, based on the total amount of the slurry. When the amount added is less than or equal to the upper limit described above, a decrease in slurry viscosity is suppressed; thus, a carbon component originating from the surfactant tends to be less likely to be left in the resulting agglomerated BN particles. When the amount added is more than or equal to the lower limit described above, an excessive increase in slurry viscosity is suppressed; thus, granulation tends to be easy.

<Binder>

The BN slurry may contain a binder in order to effectively granulate the raw-material BN powder into particles. The binder acts to firmly bind the primary BN particles and stabilize the granulated particles.

Any binder may be used as the binder used for the BN slurry as long as it can increase the adhesion of the BN particles to each other. In the present invention, the granulated particles are heat-treated after the formation of the particles. Thus, the binder preferably has heat resistance to the high-temperature conditions in the heat-treatment process.

Preferred examples of the binder that can be used include metal oxides, such as aluminum oxide, magnesium oxide, yttrium oxide, calcium oxide, silicon oxide, boron oxide, cerium oxide, zirconium oxide, and titanium oxide. Among these, aluminum oxide and yttrium oxide are preferred in view of the thermal conductivity and the heat resistance as an oxide, the bonding strength to bond the BN particles together, and so forth.

As the binder, a liquid binder, such as alumina sol, may be used. A binder that reacts to convert into another inorganic component during the heat treatment may also be used.

These binders may be used alone or in combination as a mixture of two or more.

The binder may or may not be contained, and may be contained in an amount of 0% by weight based on the raw-material BN powder in the BN slurry. When the binder is contained, the amount used (in the case of a liquid binder, the amount used as a solid content) is preferably 0.1% or more by weight, more preferably 0.5% or more by weight, even more preferably 1.0% or more by weight, and 30% or less by weight, more preferably 20% or less by weight, even more preferably 15% or less by weight, based on the raw-material BN powder in the BN slurry. When the amount of the binder used is less than or equal to the upper limit described above, the crystals grow. When the binder is used as a thermally conductive filler, the effect of improving the thermal conductivity tends to be provided.

<Method for Preparing BN Slurry>

A method for preparing the BN slurry is not particularly limited to any particular method, as long as the raw-material BN powder, a medium, and, if necessary, a binder and a surfactant are uniformly dispersed and the viscosity is adjusted to a desired range. When the raw-material BN powder, the medium, and, if necessary, the binder and the surfactant are used, the BN slurry is preferably prepared as described below.

A predetermined amount of the raw-material BN powder is placed in a resin bottle, followed by the addition of a predetermined amount of the binder. A predetermined amount of the surfactant is added thereto. Then zirconia ceramic balls are added thereto. The mixture is stirred on a pot-mill rotating table for about 0.5 to about 5 hours until a desired viscosity is obtained.

The order of the addition is not particularly limited. However, when a large amount of the raw-material BN powder is formed into a slurry, agglomerates such as lumps are easily formed. Thus, the slurry may be prepared by adding the surfactant and the binder to water to prepare an aqueous solution, adding a predetermined amount of the raw-material BN powder thereto in small portions, adding zirconia ceramic balls thereto, and dispersing the mixture on a pot-mill rotating table.

A dispersing device, such as a bead mill or a planetary mixer, may be used for dispersion, other than the pot mill.

The preparation of the slurry is preferably performed at a slurry temperature of 10° C. or higher and 60° C. or lower. When the slurry temperature is higher than or equal to the lower limit described above, an increase in slurry viscosity tends to be suppressed. When the slurry temperature is lower than or equal to the upper limit described above, the decomposition of the raw-material BN powder into ammonia in the slurry tends to be suppressed.

The slurry temperature is more preferably 15° C. or higher and 50° C. or lower, more preferably 15° C. or higher and 40° C. or lower, particularly preferably 15° C. or higher and 35° C. or lower.

<Granulation>

To produce a granulated powder from the BN slurry, a common granulation method, such as a spray-drying method, a rolling method, a fluidized bed method, or a stirring method, can be employed. Among these, the spray-drying method is preferred.

In the spray-drying method, a granulated powder of a desired size can be produced, depending on the concentration of the slurry as a raw material, the amount of the slurry fed per unit time into the apparatus, and the pressure and amount of compressed air when the fed slurry is sprayed. In the spray-drying method, a granulated spherical powder can also be produced.

A spray-drying apparatus used is not particularly limited. To form a larger granulated spherical powder, an apparatus having a rotating disk is most suitable. Examples of such an apparatus include Spray Dryer F Series, available from Ohkawara Kakohki Co., Ltd., an "MDL-050M" spray dryer available from Fujisaki Electric Corporation, and a "P260" spray dryer available from Preci Co., Ltd.

In the case where the average particle size ($D_{50}$) of the agglomerated BN powder of the present invention on a volume basis is in the range of 20 μm to 200 μm, the average particle size of the granulated powder produced by granulation is preferably 10 μm or more, more preferably 15 μm or more, and preferably 150 μm or less, more preferably 100 μm or less in terms of the average particle size ($D_{50}$) on a volume basis.

The average particle size $D_{50}$ of the granulated powder on a volume basis can be measured, for example, by a wet process with "LA920" available from Horiba, Ltd., or by a dry process with "Morphorogi" available from Malvern.

<Heat Treatment>

The granulated BN powder can be further heat-treated in a non-oxidizing gas atmosphere to produce an agglomerated BN powder.

The non-oxidizing gas atmosphere is an atmosphere of, for example, nitrogen gas, helium gas, argon gas, ammonia gas, hydrogen gas, methane gas, propane gas, or carbon monoxide gas. The crystallization rate of the agglomerate BN particles varies in accordance with the type of atmosphere gas used here. To perform crystallization in a short time, nitrogen gas or a mixed gas of nitrogen gas and another gas is particularly preferably used.

The heat treatment temperature is preferably 1,600° C. or higher, more preferably 1,800° C. or higher, and preferably 2,300° C. or lower, more preferably 2,200° C. or lower. When the heat treatment temperature is higher than or equal to the lower limit described above, the average crystallite of the primary BN particles is sufficiently grown, the agglomerated BN powder tends to have high thermal conductivity. When the heat treatment temperature is lower than or equal to the upper limit described above, for example, the decomposition of the agglomerated BN powder tends to be suppressed.

The heat treatment time is preferably 5 hours or more and 20 hours or less, more preferably 5 hours or more and 15 hours or less. When the heat treatment time is more than or equal to the lower limit described above, the crystals grow sufficiently. When the heat treatment time is less than or equal to the upper limit described above, the decomposition of BN tends to be suppressed.

To perform the heat treatment in the non-oxidizing gas atmosphere, preferably, a firing furnace is usually evacuated with a vacuum pump, and then the temperature is increased by heating to a desired temperature while a non-oxidizing gas is introduced thereinto. When air in the firing furnace can be sufficiently replaced with a non-oxidizing gas, the temperature may be increased by heating while the non-oxidizing gas is introduced thereinto under atmospheric pressure. Examples of the firing furnace include batch-type furnaces, such as muffle furnaces, tubular furnaces, and atmosphere furnaces; and continuous furnaces, such as rotary kilns, screw conveyer furnaces, tunnel furnaces, belt furnaces, pusher furnaces, and vertical continuous furnaces. These different furnaces are used for different purposes.

To reduce the nonuniformity of the composition during the firing, usually, the granulated powder to be heat-treated is placed in a graphite crucible with a circular lid and fired by heating. At this time, for the purpose of suppressing the sintering of the agglomerated BN particles in addition to the reduction in the nonuniformity of the composition, a graphite partition may be placed. The number of divisions by partitioning is not particularly limited as long as the sintering can be suppressed, and usually 2 to 16. When the number of the divisions is less than or equal to the upper limit described above, the sintering is suppressed, the crystals of primary h-BN particles tend to grow sufficiently. When the number of the divisions is more than or equal to the lower limit described above, the progress of sintering tends to be suppressed.

<Classification>

The agglomerated BN powder that has been heat-treated is preferably subjected to classification treatment in order to narrow the particle size distribution and suppress an increase in viscosity when the agglomerated BN powder is mixed to prepare an agglomerated BN powder-containing resin composition. This classification is usually performed after the heat treatment of the granulated powder. However, the granulated powder before the heat treatment may be subjected to the classification and then heat treatment.

The classification may be performed by either wet or dry process. Dry classification is preferred from the viewpoint of suppressing the decomposition of BN. In particular, in the case where the binder is soluble in water, dry classification is preferably used.

Examples of the dry classification include sieve classification and air classification owing to a difference between a centrifugal force and a fluid drag force. The dry classification can be performed with a classifier, such as a spiral-flow classifier, a forced-vortex centrifugal classifier, or a semi-free vortex centrifugal classifier. These classifiers may be appropriately used in accordance with the particle size of particles to be classified. For example, the spiral-flow classifier is used for classifying fine particles in the submicron to single micron size range, and the semi-free vortex centrifugal classifier is used for classifying relatively larger sized particles.

<Contrivance to Manufacture Agglomerated BN Powder of Present Invention>

A method for manufacturing the agglomerated BN powder having a tap density of 0.6 g/ml or more and less than 0.8 g/ml and an interparticle void volume of 0.5 ml/g or more according to the present invention is not particularly limited, but the following methods are exemplified.

An example of the method for manufacturing the agglomerated BN powder of the present invention is a method in which after the heat treatment, the agglomerated BN powder is collected not from a portion of the heat-treated powder adjacent to the inner wall surface of the crucible but from a portion of the heat-treated powder located away from the inner wall surface of the crucible.

A region in the vicinity of the inner wall surface of the crucible tends to be greatly affected by the material of the crucible and the material of the heating furnace. Thus, there is a tendency to collect the agglomerated BN particles having a high tap density outside the specified range of the present invention.

The inside of the crucible (a region away from the inner wall of the crucible) tends to be less affected by the material of the crucible and the material of the heating furnace. Thus, the agglomerated BN particles having a tap density within the specified range of the present invention tend to be collected from the middle portion of the crucible.

The tap density and the interparticle void volume of the agglomerated BN powder vary in accordance with, for example, the growth of the primary BN particles and the shape of the agglomerated BN particles. The particle growth of the primary BN particles and the shape of the agglomerated BN particles vary in accordance with the oxygen concentration in the raw-material BN. Thus, the tap density and the interparticle void volume can be adjusted within the specified range of the present invention by heat treatment while controlling the oxygen concentration. Specific examples thereof include heating in the presence of carbon serving as a reductant; and a method in which the oxygen concentration is adjusted under reduced pressure.

An example of a method for controlling the oxygen concentration other than the above-mentioned method is a method including multi-step heat treatment in which the temperature is held in the crystal growth temperature range of the primary BN particles for prolonged periods of time, and then heat treatment is performed at a higher temperature than the crystal growth temperature range.

The above methods may be employed alone or in combination.

[Agglomerated BN Powder-Containing Resin Composition]

To manufacture the heat dissipation sheet of the present invention containing the agglomerated BN powder of the present invention, usually, a resin composition containing at least the agglomerated BN powder, serving as an inorganic filler, of the present invention and a resin (hereinafter, also referred to as an "agglomerated BN powder-containing composition of the present invention" or a "composition of the present invention") is prepared, and the resulting composition of the present invention is formed into a sheet, which is the heat dissipation sheet of the present invention. The agglomerated BN powder-containing composition of the present invention will be described below.

The agglomerated BN powder-containing resin composition of the present invention usually contains, for example, a resin component, preferably a thermosetting resin component, an inorganic filler containing the agglomerated BN powder of the present invention, a curing agent, a curing catalyst, other components used as needed, and a solvent for the preparation of a slurry for application.

When a composite formed product described below is produced, preferably, the composition of the present invention further contains a compound having a nitrogen atom-containing heterocyclic structure from the viewpoint of improving the adhesion to a metal.

[Components Other than Inorganic Filler]

<Thermosetting Resin Component>

The thermosetting resin contained in the composition of the present invention is not particularly limited as long as it is cured in the presence of the curing agent and t curing catalyst. Specific examples of the thermosetting resin include epoxy resins, phenolic resins, polycarbonate resins, unsaturated polyester resins, urethane resins, melamine resins, and urea resins. Among these, epoxy resins are preferred in view of viscosity, heat resistance, hygroscopicity, and handleability. Examples of epoxy resins include epoxy group-containing silicon compounds, aliphatic epoxy resins, bisphenol A or F-type epoxy resins, novolac-type epoxy resins, alicyclic epoxy resins, glycidyl ester-type epoxy resins, multifunctional epoxy resins, and polymeric epoxy resins.

<<Epoxy Resin>>

Epoxy resin is a general term for a compound having one or more oxirane rings (epoxy groups) in its molecule.

An oxirane ring (epoxy group) contained in an epoxy resin may be any of an alicyclic epoxy group and a glycidyl group, but a glycidyl group is more preferred in view of the reaction rate or heat resistance.

The epoxy resin used in the present invention may be a compound containing an aromatic oxirane ring (epoxy group). Specific examples thereof include bisphenol-type epoxy resins prepared by glycidylation of bisphenols, such as bisphenol A, bisphenol F, bisphenol AD, bisphenol S, tetramethyl bisphenol A, tetramethyl bisphenol F, tetramethyl bisphenol AD, tetramethyl bisphenol S, and tetrafluoro bisphenol A; biphenyl-type epoxy resins; epoxy resins prepared by glycidylation of dihydric phenols, such as dihydroxynaphthalene and 9,9-bis(4-hydroxyphenyl)fluorene; epoxy resins prepared by glycidylation of trisphenols, such as 1,1,1-tris(4-hydroxyphenyl)methane; epoxy resins prepared by glycidylation of tetrakisphenols, such as 1,1,2,2-tetrakis(4-hydroxyphenyl)ethane; and novolac-type epoxy resins prepared by glycidylation of novolacs, such as phenolic novolac, cresol novolac, bisphenol A novolac, and brominated bisphenol A novolac.

An epoxy resin suitable as an epoxy resin used in the present invention (hereinafter, also referred to as a "specific epoxy resin") and a multifunctional epoxy resin suitably used in combination with the specific epoxy resin will be described below.

In the following description, the term "organic group" includes any group containing a carbon atom. Examples thereof include alkyl groups, alkenyl groups, and aryl groups. These groups may each be substituted with a halogen atom, a heteroatom-containing group, or another hydrocarbon group.

<<Specific Epoxy Resin>>

An example of the specific epoxy resin is an epoxy resin having at least one structure selected from a structure represented by structural formula (1) (hereinafter, also referred to as "structure (1)") and a structure represented by structural formula (2) (hereinafter, also referred to as "structure (2)").

[Chem. 1]

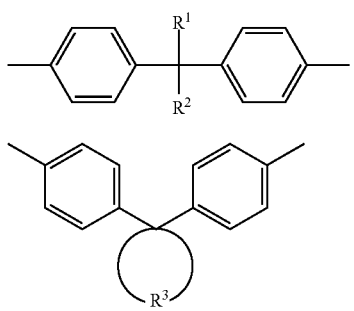

(1)

(2)

In formula (1), $R^1$ and $R^2$ are each an organic group, and at least one of them is an organic group having a molecular weight of 16 or more. In formula (2), $R^3$ is a divalent cyclic organic group.

An example of the specific epoxy resin is an epoxy resin having a structure represented by structural formula (3) (hereinafter, also referred to as "structure (3)").

[Chem. 2]

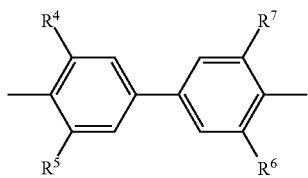

(3)

In formula (3), $R^4$, $R^5$, $R^6$, and $R^7$ are each an organic group having a molecular weight of 15 or more.

In formula (1), at least one of $R^1$ and $R^2$ is an organic group having a molecular weight of 16 or more, preferably 16 to 1,000. Examples of the organic group having a molecular weight of 16 or more include alkyl groups, such as an ethyl group, a propyl group, a butyl group, a pentyl group, a hexyl group, and a heptyl group, and aryl groups, such as a phenyl group, a tolyl group, a xylyl group, a naphthyl group, and a fluorenyl group. Each of $R^1$ and $R^2$ may be an organic group having a molecular weight of 16 or more. One of them may be an organic group having a molecular weight of 16 or more, and the other may be an organic group having a molecular weight of 15 or less or a hydrogen atom. Preferably, one of $R^1$ and $R^2$ is an organic group having a molecular weight of 16 or more, and the other is an organic group having a molecular weight of 15 or less. In particular, it is preferable that one of $R^1$ and $R^2$ be a methyl group and the other be a phenyl group because of ease of control of the handleability, such as resin viscosity, and in view of the strength of the cured product.

In formula (2), $R^3$ is a divalent cyclic organic group and may be an aromatic ring structure, such as a benzene ring structure, a naphthalene ring structure, or a fluorene ring structure, or may be an alicyclic structure, such as cyclobutane, cyclopentane, or cyclohexane. These may each independently have a substituent, such as a hydrocarbon group or a halogen atom. The divalent linking moiety may be a divalent group on a single carbon atom or a divalent group on different carbon atoms. Preferred examples thereof include a divalent aromatic group having 6 to 100 carbon atoms and a group derived from a cycloalkane having 2 to 100 carbon atoms, such as cyclopropane or cyclohexane. In particular, $R^3$ is preferably a 3,3,5-trimethyl-1,1-cyclohexylene group represented by structural formula (4) from the viewpoints of the control of the handleability such as resin viscosity and the strength of the cured product.

[Chem. 3]

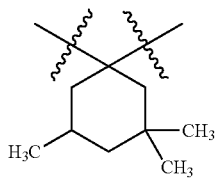

(4)

In formula (3), $R^4$, $R^5$, $R^6$, and $R^7$ are each an organic group having a molecular weight of 15 or more, preferably an alkyl group having a molecular weight of 15 to 1,000. In particular, it is preferable that each of $R^4$, $R^5$, $R^6$, and $R^7$ be a methyl group from the viewpoints of the control of the handleability such as resin viscosity and the strength of the cured product.

In particular, the specific epoxy resin is preferably an epoxy resin including one of structures (1) and (2) and including structure (3) from the viewpoint of achieving a reduction in the hygroscopicity and the maintenance of the strength of the heat dissipation sheet, which is a cured product.

The specific epoxy resin contains larger amounts of hydrophobic hydrocarbon and aromatic structures than a common epoxy resin having a bisphenol A or F skeleton. Thus, the incorporation of the specific epoxy resin can reduce the amount of moisture absorbed by the heat dissipation sheet, which is the resulting cured product.

From the viewpoint of reducing the amount of moisture absorbed, the specific epoxy resin preferably contains large amounts of structures (1), (2), and (3), which are hydrophobic structures. Specifically, the specific epoxy resin is preferably an epoxy resin having a weight-average molecular weight of 10,000 or more, more preferably an epoxy resin having a weight-average molecular weight of 20,000 or more, even more preferably an epoxy resin having a weight-average molecular weight of 30,000 or more, for example, 30,000 to 40,000.

The specific epoxy resin is preferably more hydrophobic. Specifically, the specific epoxy resin having a higher epoxy equivalent is better, and preferably has an epoxy equivalent of 5,000 g/eq or more, more preferably 7,000 g/eq or more, for example, 8,000 to 15,000 g/eq.

The weight-average molecular weight of an epoxy resin refers to a value measured by gel permeation chromatography in terms of polystyrene.

The epoxy equivalent is defined as "the weight of an epoxy resin containing one equivalent of epoxy groups" and can be measured in accordance with JIS K7236.

These specific epoxy resins may be used alone or in combination of two or more.

<<Multifunctional Epoxy Resin>>

The multifunctional epoxy resin refers to an epoxy resin having three or more oxirane rings (epoxy groups) per molecule.

From the viewpoint of increasing the storage modulus of the cured product after thermal curing, especially increasing the high-temperature storage modulus, which is important for, for example, power semiconductors that generate a large amount of heat, an epoxy resin having two or more oxirane rings (epoxy groups) in its molecule is preferred, an epoxy resin having three or more oxirane rings (epoxy groups) in its molecule is more preferred, and an epoxy resin having four or more glycidyl groups in its molecule is even more preferred.

The presence of multiple oxirane rings (epoxy groups), especially glycidyl groups, in its molecule results in the cured product having an improved crosslink density. Thus, the heat dissipation sheet, which is the resulting cured product, has higher strength. When internal stress is generated in the heat dissipation sheet in a moisture absorption reflow test, the heat dissipation sheet maintains its form without being deformed or broken, thereby enabling the suppression of the formation of gaps, such as voids, in the heat dissipation sheet.

The multifunctional epoxy resin preferably has a molecular weight of 1,000 or less, particularly preferably 100 to 800 from the viewpoint of increasing the storage modulus of the heat dissipation sheet after thermal curing.

The addition of the multifunctional epoxy resin enables the introduction of highly polar oxirane rings (epoxy groups) in high density, thereby increasing the effect of physical interactions, such as van der Waals forces and hydrogen bonds, and improving the adhesion between the metal and the heat dissipation sheet of the present invention, which is a cured resin product, in the composite formed product described below. Moreover, the addition of the multifunctional epoxy resin enables the heat dissipation sheet after thermal curing to have a high storage modulus.

After the cured product of the thermosetting resin composition enters the irregularities of the metal as the adherend, a strong anchor effect is provided to improve the adhesion between the metal and the heat dissipation sheet.

The introduction of the multifunctional epoxy resin tends to increase the hygroscopicity of the thermosetting resin composition. The improvement in the reactivity of the oxirane rings (epoxy groups) can reduce the amount of hydroxy groups during reaction to suppress an increase in hygroscopicity. The thermosetting resin composition is produced by combining the above-mentioned specific epoxy resin with the multifunctional epoxy resin, thereby achieving both high elasticity and low hygroscopicity of the resulting heat dissipation sheet.

As the multifunctional epoxy resin, specifically, an epoxy resin having three or more epoxy groups is preferred. Examples of the epoxy resin that can be used include EX321L, DLC301, and DLC402 available from Nagase ChemteX Corporation.

These multifunctional epoxy resins may be used alone or in combination of two or more.

<<Content>>

The composition of the present invention preferably contains the thermosetting resin component in an amount of 5% or more by weight, particularly 50% or more by weight, and 99% or less by weight, particularly 98% or less by weight based on 100% by weight of the composition of the present invention, excluding the solvent and the inorganic filler. When the thermosetting resin component content is more than or equal to the lower limit described above, the moldability is good. When the thermosetting resin component content is less than or equal to the upper limit described above, the amounts of other components contained can be ensured, thereby enhancing the thermal conductivity.

In the composition of the present invention, the thermosetting resin component preferably contains the epoxy resin in an amount of 20% to 100% by weight, particularly 45% to 100% by weight.

The composition of the present invention preferably contains the specific epoxy resin, which is the preferable epoxy resin described above, in an amount of 50% or less by weight, particularly 40% or less by weight, and 5% or more by weight, particularly 10% or more by weight based on the total epoxy resins. When the specific epoxy resin content is more than or equal to the lower limit described above, the above-mentioned effect owing to the incorporation of the specific epoxy resin can be effectively provided. An excessively high specific epoxy resin content results in a decrease in crosslink density to embrittle the cured product. When the specific epoxy resin content is less than or equal to the upper limit described above, it is possible to suppress the hygroscopicity of the cured product, improve the strength performance of the cured product, and achieve both of these performances.

The composition of the present invention preferably contains the multifunctional epoxy resin, which is the preferred epoxy resin described above, in an amount of 5% or more by weight, particularly 10% or more by weight, and 50% or less by weight, particularly 40% or less by weight based on the total epoxy resins. When the multifunctional epoxy resin content is more than or equal to the lower limit described above, the above-mentioned effect owing to the incorporation of the multifunctional epoxy resin can be effectively provided. When the multifunctional epoxy resin content is less than or equal to the upper limit described above, it is possible to suppress the hygroscopicity of the cured product, improve the strength performance of the cured product, and achieve both of these performances.

The composition of the present invention preferably contains, as the epoxy resin, both the specific epoxy resin and the multifunctional epoxy resin in order to achieve both high elasticity and low hygroscopicity of the resulting cured product. In this case, the ratio of the specific epoxy resin content to the multifunctional epoxy resin content is preferably specific epoxy resin:multifunctional epoxy resin=10 to 90:90 to 10, particularly 20 to 80:80 to (ratio by weight).

Examples of an epoxy resin other than the specific epoxy resin or the multifunctional epoxy resin contained in the composition of the present invention include, but are not particularly limited to, various bisphenol-type epoxy resins, such as bisphenol A-type epoxy resins and bisphenol F-type epoxy resins, prepared by glycidylation of bisphenols, various biphenyl-type epoxy resins prepared by glycidylation of biphenyls, epoxy resins prepared by glycidylation of compounds having two hydroxy groups and aromaticity, such as dihydroxynaphthalene and 9,9-bis(4-hydroxyphenyl)fluorene, epoxy resins prepared by glycidylation of trisphenols, such as 1,1,1-tris(4-hydroxyphenyl)methane, epoxy resins prepared by glycidylation of tetrakisphenols, such as 1,1,2,2-tetrakis(4-hydroxyphenyl)ethane, novolac-type epoxy resins prepared by glycidylation of novolacs, such as phenolic novolac, cresol novolac, bisphenol A novolac, and brominated bisphenol A novolac, and silicone-containing epoxy resins. The epoxy resin is preferably one or two or more selected therefrom.

<Compound Having Nitrogen Atom-Containing Heterocyclic Structure>

The compound having a nitrogen atom-containing heterocyclic structure (hereinafter, also referred to as a "nitrogen-containing heterocyclic compound") is effective in improving the adhesion between the cured product of the composition of the present invention and a metal.

When the composition of the present invention is combined with the metal, the nitrogen-containing heterocyclic compound is located at the interface therebetween, improving the adhesion between the composition of the present invention and the metal. From this point of view, the nitrogen-containing heterocyclic compound preferably has a low molecular weight in order to facilitate the presence of the nitrogen-containing heterocyclic compound at the interface between the composition of the present invention and the metal. The nitrogen-containing heterocyclic compound preferably has a molecular weight of 1,000 or less, more preferably 500 or less.

Examples of the heterocyclic structure of the nitrogen-containing heterocyclic compound include structures derived from imidazole, triazine, triazole, pyrimidine, pyrazine, pyridine, and azole. From the viewpoint of improving the insulating properties of the thermosetting resin composition and adhesion to the metal, an imidazole-based compound and a triazine-based compound are preferred.

Preferred examples of the imidazole-based compound and the triazine-based compound include 2-ethyl-4-methylimidazole, 2-phenylimidazole, 1-benzyl-2-methylimidazole, imidazole, 1-benzyl-2-phenylimidazole, 1-cyanoethyl-2-undecylimidazole, 1-cyanoethyl-2-ethyl-4-methylimidazole, 2-phenyl-4-methylimidazole, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, an isocyanuric acid adduct of 2,4-diamino-6-[2'-methylimidazolyl-(1')]-ethyl-s-triazine, an isocyanuric acid adduct of 2-phenylimidazole, 2-phenyl-4,5-dihydroxymethylimidazole, 2-phenyl-4-methyl-5-hydroxymethylimidazole, 2,4-diamino-6-vinyl-s-triazine, an isocyanuric acid adduct of 2,4-diamino-6-vinyl-s-triazine, 2,4-diamino-6-methacryloyloxyethyl-s-triazine, and an isocyanuric acid adduct of 2,4-diamino-6-methacryloyloxyethyl-s-triazine.

Among these, in particular, a nitrogen-containing heterocyclic compound having a structure derived from imidazole and a nitrogen-containing heterocyclic compound having a structure derived from triazine are preferred because the high compatibility with resin and the high reaction activation temperature enable easy adjustment of the curing rate and the physical properties after curing, thereby achieving an improvement in the storage stability of the composition of the present invention and a further improvement in adhesive strength after hot forming. A nitrogen-containing heterocyclic compound having a structure derived from triazine is especially preferred. As the heterocyclic structure of the nitrogen-containing heterocyclic compound, a structure derived from 1,3,5-triazine is particularly preferred. The nitrogen-containing heterocyclic compound may have the multiple structural moieties exemplified above.

The nitrogen-containing heterocyclic compound can contain a curing catalyst in accordance with its structure. Accordingly, the composition of the present invention may contain the nitrogen-containing heterocyclic compound as a curing catalyst.

Only a single type of nitrogen-containing heterocyclic compound may be used. Two or more types of nitrogen-containing heterocyclic compounds may be used in combination. The nitrogen-containing heterocyclic compound may have multiple heterocyclic structures simultaneously in one molecule.

The nitrogen-containing heterocyclic compound is preferably contained in an amount of 0.001% or more by weight, particularly 0.1% or more by weight, and 10% or less by weight, particularly 5% or less by weight based on 100% by weight of the composition of the present invention, excluding the solvent and the inorganic filler. In the case where the curing catalyst described below is included in the nitrogen-containing heterocyclic compound in terms of its molecular structure, the total amount including the amount of the curing catalyst is preferably in the above range. When the nitrogen-containing heterocyclic compound content is more than or equal to the lower limit described above, the above-mentioned effects owing to the incorporation of this compound can be sufficiently provided. When the nitrogen-containing heterocyclic compound content is less than or equal to the upper limit described above, the reaction proceeds effectively to improve the crosslink density, thereby increasing the strength and improving the storage stability.

<Curing Agent>

The curing agent is preferably, but not particularly limited to, a phenolic resin, an acid anhydride having an aromatic skeleton or alicyclic skeleton, a hydrogenated product of the acid anhydride, or the modified product of the acid anhydride. The use of the preferred curing agent enables the formation of the cured resin product having a good balance of heat resistance, moisture resistance, and electrical properties. Only a single type of curing agent may be used. Two or more types of curing agents may be used in combination.

The phenolic resin is not particularly limited. Specific examples of the phenolic resin include phenolic novolac, o-cresol novolac, p-cresol novolac, tert-butylphenol novolac, dicyclopentadiene cresol, poly(p-vinylphenol), bisphenol A-type novolac, xylylene-modified novolac, decalin-modified novolac, poly(di-o-hydroxyphenyl)methane, poly(di-m-hydroxyphenyl)methane, and poly(di-p-hydroxyphenyl)methane. Among these, a novolac-type phenolic resin having a rigid main-chain skeleton and a phenolic resin having a triazine skeleton are preferred in order to further improve the flexibility and the flame retardancy of the thermosetting resin composition and to improve the mechanical properties and the heat resistance of the cured resin product. To improve the flexibility of the uncured thermosetting resin composition and the toughness of the cured resin product, an allyl group-containing phenolic resin is preferred.

Examples of a commercially available phenolic resin include MEH-8005, MEH-8000H, and NEH-8015 (all available from Meiwa Plastic Industries, Ltd.), YLH903 (available from Mitsubishi Chemical Corporation), LA-7052, LA-7054, LA-7751, LA-1356, and LA-3018-50P (all available from Dainippon Ink and Chemicals, Inc.), and PSM6200, PS6313, and PS6492 (available from Gun Ei Chemical Industry Co., Ltd).

The acid anhydride having an aromatic skeleton, the hydrogenated product of the acid anhydride, and the modified product of the acid anhydride are not particularly limited. Specific examples thereof include SMA resin EF30 and SMA resin EF60 (all available from Sartomer Japan), ODPA-M and PEPA (all available from Manac Inc.), Rikacid MTA-10, Rikacid TMTA, Rikacid TMEG-200, Rikacid TMEG-500, Rikacid TMEG-S, Rikacid TH, Rikacid MH-700, Rikacid MT-500, Rikacid DSDA, and Rikacid TDA-100 (all available from New Japan Chemical Co., Ltd.), and EPICLON B4400 and EPICLON B570 (all available from Dainippon Ink and Chemicals, Inc).

The acid anhydride having an alicyclic skeleton, the hydrogenated product of the acid anhydride, or the modified product of the acid anhydride is preferably an acid anhydride having a polyalicyclic skeleton, a hydrogenated product of the acid anhydride, or a modified product of the acid anhydride; or an acid anhydride having an alicyclic skeleton prepared by the addition reaction of a terpene-based compound and maleic anhydride, a hydrogenated product of the acid anhydride, or a modified product of the acid anhydride. Specific examples thereof include Rikacid HNA and Rikacid HNA-100 (all available from New Japan Chemical Co., Ltd.) and Epicure YH306 and Epicure YH309 (all available from Mitsubishi Chemical Corporation).

The curing agent is preferably contained in an amount of 0% to 70% by weight, particularly 0% to 55% by weight based on 100% by weight of the composition of the present invention, excluding the solvent and the inorganic filler. When the curing agent content is more than or equal to the lower limit described above, sufficient curing performance can be obtained. When the curing agent content is less than or equal to the upper limit described above, the reaction proceeds effectively to improve the crosslink density, thereby increasing the strength and improving the storage stability.

<Curing Catalyst>

The composition of the present invention preferably contains the curing catalyst together with the curing agent in order to adjust the curing rate and the physical properties of the cured product.

The curing catalyst is not particularly limited, but is appropriately selected in accordance with the types of the thermosetting resin component and the curing agent used. Specific examples of the curing catalyst include chain or cyclic tertiary amines, organophosphorus compounds, salts of organic acids, such as quaternary phosphonium salts, and diazabicycloalkenes. As the curing catalyst, an organometallic compounds, quaternary ammonium salts, and metal halides can also be used. Examples of the organometallic compounds include zinc octanoate, tin octanoate, and aluminum complex of acetylacetone.

These may be used alone or in combination of two or more.

The curing catalyst is preferably contained in an amount of 0.1% to 10% by weight, particularly 0.1% to 5% by weight based on 100% by weight of the composition of the present invention, excluding the solvent and the inorganic filler. When the curing catalyst content is more than or equal to the lower limit described above, the progress of the curing reaction can be sufficiently promoted to achieve good curing. When the curing catalyst content is less than or equal to the upper limit described above, the curing rate is not excessively high. Accordingly, the composition of the present invention has good storage stability.

<Other Components>

The composition of the present invention may contain, as components other than the inorganic filler, other components other than the above to the extent that the effects of the present invention are not impaired. The other components include surface treatment agents such as silane coupling agents that improve the interfacial adhesive strength between the inorganic filler and the resin component when the composition of the present invention is used to form a cured resin product, insulating carbon components such as reductants, viscosity modifiers, dispersants, thixotropic agents, flame retardants, colorants, organic fillers, organic solvents, and thermoplastic resins.

Among these, the incorporation of such a dispersant in the composition of the present invention enables the formation of a uniform cured resin product, so that the resulting cured resin product has improved thermal conductivity and dielectric breakdown characteristics, in some cases. The incorporation of an organic filler and a thermoplastic resin in the composition of the present invention imparts moderate extensibility to the composition, so that the stress generated can be relieved to suppress the occurrence of cracking in a temperature cycling test, in some cases.

The dispersant preferably has a functional group containing a hydrogen atom having hydrogen bonding properties. When the dispersant has the functional group containing a hydrogen atom with hydrogen bonding properties, the heat dissipation sheet, which is a cured product to be formed, can have further improved thermal conductivity and dielectric breakdown characteristics. Examples of the functional group containing a hydrogen atom having hydrogen bonding properties include a carboxy group (pKa=4), a phosphate group (pKa=7), and a phenolic group (pKa=10).

The pKa of the functional group containing a hydrogen atom having hydrogen bonding properties is preferably in the range of 2 to 10, more preferably in the range of 3 to 9. When the pKa is 2 or more, the acidity of the dispersant is in an appropriate range, so that the reaction of the epoxy resin in the thermosetting resin component is easily suppressed, in some cases. Accordingly, when a formed product in an uncured state is stored, the storage stability tends to be improved. When the pKa is 10 or less, the function as a dispersant is sufficiently fulfilled, so that the heat dissipation sheet, which is a cured product to be formed, tends to have sufficiently enhanced thermal conductivity and dielectric breakdown characteristics.

The functional group containing a hydrogen atom having hydrogen bonding properties is preferably a carboxy group or a phosphate group. These functional groups can further enhance the thermal conductivity and dielectric breakdown properties of the heat dissipation sheet.

Specific examples of the dispersant include polyester carboxylic acids, polyether carboxylic acids, polyacrylic carboxylic acids, aliphatic carboxylic acids, polysiloxane carboxylic acids, polyester phosphoric acids, polyether phosphoric acids, polyacrylic phosphoric acids, aliphatic phosphoric acids, polysiloxane phosphoric acids, polyester phenols, polyether phenols, polyacrylic phenols, and polysiloxane phenols. Only a single type of dispersant may be used. Two or more types of dispersants may be used in combination.

As the thermoplastic resin, any commonly known thermoplastic resin can be used. Examples thereof include vinyl polymers, such as polyethylene, polypropylene, polystyrene, poly(vinyl chloride), (meth)acrylic resins, ethylene-vinyl acetate copolymers, and ethylene-vinyl alcohol copolymers, polyesters, such as polylactic resins, poly(ethylene terephthalate), and poly(butylene terephthalate), polyamides, such as nylon and poly(amide amine), poly(vinyl acetal) resins, such as poly(vinyl acetoacetal), poly(vinyl benzal), and poly(vinyl butyral) resins, ionomer resins, poly(phenylene ether), poly(phenylene sulfide), polycarbonate, poly(ether ether ketone), polyacetal, ABS resins, liquid crystal polymers (LCPs), fluorocarbon resins, urethane resins, silicone resins, various elastomers, and modified products of these resins.

These thermoplastic resins may be homogeneous in the resin phase of the heat dissipation sheet. Alternatively, these thermoplastic resins may be phase-separated, and their shapes may be recognized. When the thermoplastic resin is phase-separated, the thermoplastic resin in the heat dissipation sheet may be in the form of particles or fibers. In the case where the shape of the thermoplastic resin is recognized in the heat dissipation sheet, the thermoplastic resin might be recognized as an organic filler. In the present invention, however, the organic filler refers to a natural product, such as wood flour, optionally modified cellulose or starch, or any of various organic pigments. The thermoplastic resin is not included in the organic filler.

The incorporation of the thermoplastic resin and the organic filler imparts moderate extensibility to the composition, so that the stress generated can be relieved to suppress the occurrence of cracking in a temperature cycling test, in some cases.

In the case where the thermoplastic resin and the organic filler are insoluble in the thermosetting resin, it is possible to prevent an increase in the viscosity of the composition of the present invention, and, for example, when the composition is formed into a sheet as described below, the surfaces of the sheet can have improved smoothness. In this case, the thermoplastic resin and the organic filler that are insoluble in the thermosetting resin are mixed together with a large amount of inorganic filler to efficiently disperse a thermoplastic, extendable component phase in the cured product, which can easily relieve stress. Accordingly, the occurrence of cracking in the cured product can be suppressed without decreasing the elastic modulus of the cured product. For these reasons, a polyamide resin, such as nylon, a cellulose resin, and so forth are preferred as thermoplastic resin. In particular, the polyamide resin, such as nylon, is preferred.

In the case where the thermoplastic resin that can be observed in the heat dissipation sheet, which is a cured product, is in the form of particles, the upper limit of the average particle size is preferably 100 μm or less, more preferably 50 μm or less, even more preferably 30 μm or less. When the average particle size is less than or equal to the upper limit described above, a sheet-like cured product having any of various thicknesses can be formed without causing a decrease in thermal conductivity. The average particle size of the thermoplastic resin in the form of particles is determined by observing the section of the cured product and averaging the maximum diameters of freely-selected 20 particles.

The composition of the present invention may contain an organic solvent, for example, in order to improve the applicability when the sheet-like cured product is formed through an application process.

Examples of the organic solvent that can be contained in the composition of the present invention include methyl ethyl ketone, cyclohexanone, propylene glycol monomethyl ether acetate, butyl acetate, isobutyl acetate, and propylene glycol monomethyl ether. These organic solvents may be used alone or in combination of two or more.

When the composition of the present invention contains the organic solvent, the organic solvent content is appropriately determined in accordance with the handleability during the production of the heat dissipation sheet. Usually, the organic solvent is preferably used in such a manner that the solid content (total of components other than the solvent) concentration in the composition of the present invention is 10% or more by weight, particularly 40% or more by weight, and 90% or less by weight, particularly 80% or less by weight.

[Inorganic Filler]

The composition of the present invention contains at least the agglomerated BN powder of the present invention as an inorganic filler.

The composition of the present invention may contain an inorganic filler other than the agglomerated BN powder of the present invention. In that case, a preferred example of the inorganic filler other than the agglomerated BN powder of the present invention is a spherical filler.

The spherical filler used together with the agglomerated BN powder of the present invention preferably has a thermal conductivity of 10 W/m·K or more, more preferably 15 W/m·K or more, even more preferably 20 W/m·K or more. The spherical filler used together with the agglomerated BN powder of the present invention preferably has a new Mohs hardness of 3.1 or more, more preferably 5 or more. In particular, the spherical filler used together with the agglomerated BN powder of the present invention preferably has a thermal conductivity of 20 to 30 W/m·K and a new Mohs hardness of 5 to 10. The use of the spherical filler in combination with the agglomerated BN powder of the present invention enables the resulting heat dissipation sheet to have enhanced adhesive force to the metal and improved heat dissipation characteristics.

The term "spherical" used here may indicate a shape generally recognized as a spherical shape. For example, a shape having an average circularity of 0.4 or more may be regarded as a spherical shape, and a shape having an average circularity of 0.6 or more may be regarded as a sphere-like shape. The upper limit of the average circularity is usually 1. The circularity can be measured by image processing of the projected image. The circularity can be measured, for example, with an FPIA series available from Sysmex Corporation.

The spherical filler is preferably at least one selected from the group consisting of alumina, synthetic magnesite, crystalline silica, aluminum nitride, silicon nitride, silicon carbide, zinc oxide, and magnesium oxide. The use of the preferred spherical filler enables the resulting heat dissipation sheet to have further improved heat dissipation characteristics.

The average particle size of the spherical filler is preferably within the range of 0.5 μm to 40 μm. When the average particle size is 0.5 μm or more, the resin and the filler can flow easily during hot forming, thereby possibly increasing the interfacial adhesive force of the heat dissipation sheet. When the average particle size is 40 μm or less, the dielectric breakdown characteristics of the heat dissipation sheet are easily maintained.

As other inorganic fillers, electrically insulating inorganic fillers can be used. Examples thereof include particles composed of at least one selected from the group consisting of carbon, metal carbides, metal oxides, and metal nitrides. An example of carbon is diamond. Examples of metal carbides include silicon carbide, titanium carbide, and tungsten carbide. Examples of metal oxides include magnesium oxide, aluminum oxide, silicon oxide, calcium oxide, zinc oxide, yttrium oxide, zirconium oxide, cerium oxide, ytterbium oxide, and SIALONs (ceramics consisting of silicon, aluminum, oxygen, and nitrogen). Examples of metal nitrides include boron nitride other than the agglomerated BN particles of the present invention, aluminum nitride, and silicon nitride.

The shape of other inorganic fillers is not limited and may be in the form of particles, whiskers, fibers, plates, or aggregates thereof.

These inorganic fillers may be surface-treated with a surface treatment agent. As the surface treatment agent, a known surface treatment agent can be used.

These inorganic fillers may be used alone or in any combination and any proportion as a mixture.

The inorganic filler content of the composition of the present invention is preferably 30% or more by weight, more preferably 40% or more by weight, even more preferably 50% or more by weight based on 100% by weight of the composition of the present invention, excluding the solvent. The inorganic filler content is preferably 99% or less by weight, more preferably 90% or less by weight, even more preferably 80% or less by weight.

When the inorganic filler content is more than or equal to the lower limit described above, the effects of improving thermal conductivity and controlling the coefficient of linear expansion through the incorporation of the inorganic filler can be sufficiently provided. When the inorganic filler content is less than or equal to the upper limit described above, the formability of the cured product and the interfacial adhesion of the composite formed product described below tend to be provided.

When the agglomerated BN powder of the present invention and the spherical filler composed of, for example, alumina, are used in combination as the inorganic filler, the ratio by weight of the amount of the agglomerated BN powder of the present invention contained to the amount of the spherical filler contained in the composition of the present invention is not particularly limited, but is preferably 90:10 to 10:90, preferably 80:20 to 20:80.

To effectively provide the effects of using the agglomerated BN powder of the present invention, the agglomerated BN powder of the present invention preferably accounts for 30% or more by weight, particularly 40% or more by weight of the inorganic filler used. In the present invention, it is preferable to use only the agglomerated BN powder of the present invention or only the agglomerated BN powder of the present invention and the above-mentioned spherical filler as the inorganic filler.

<Method for Manufacturing Composition of Present Invention>

The composition of the present invention can be manufactured by uniformly mixing the inorganic filler containing the agglomerated BN powder of the present invention, the resin component, such as the thermosetting resin, and, other components added as needed using stirring and kneading. For example, a common kneading machine, such as, a mixer, a kneader, or a single- or twin-screw kneader can be used for the mixing. When the mixing is performed, the mixture may be heated as needed.

The order in which the components are mixed is freely-selected as long as there is no particular problem, such as the occurrence of reaction or precipitation. An example of the method is as follows: The thermosetting resin component is mixed with and dissolved in the organic solvent (for example, methyl ethyl ketone) to prepare a resin solution. The resulting resin solution is mixed with a mixture prepared by sufficiently mixing the inorganic filler and other components together. Then the resulting mixture is mixed with the organic solvent for adjusting the viscosity. Furthermore, the resulting mixture is mixed with additives, such as a curing agent, a curing accelerator, and a dispersant.

[Heat Dissipation Sheet]

A method for manufacturing the heat dissipation sheet of the present invention by forming the composition of the present invention into a sheet-like cured product will be described below.

The sheet-like cured product can be manufactured by a method usually employed. For example, the sheet-like cured product can be manufactured by forming the composition of the present invention into a sheet-like shape and curing it.

As a method for forming the composition of the present invention into a sheet-like shape, a commonly employed method can be employed.

For example, when the composition of the present invention has plasticity and flowability, the composition can be formed into a desired shape, for example, by curing the composition filled in a mold. In this case, injection molding, injection compression molding, extrusion molding, compression molding, or vacuum compression molding can be employed.

The solvent in the composition of the present invention can be removed by a known heating method with a hot plate, a hot-air oven, an IR heating furnace, a vacuum dryer, or a high-frequency heating machine.

The sheet-like cured product can also be formed by cutting the cured product of the composition of the present invention into a desired shape.

The sheet-like cured product can also be made by forming a slurry containing the composition of the present invention (hereinafter, referred to as a "slurry for a sheet") into a sheet-like shape by a method, such as a doctor blade method, a solvent casting method, or an extrusion film-forming method.

An example of the method for manufacturing a sheet-like cured product from the slurry for a sheet will be described below.

<Application Step>

First, a coating film is formed on a surface of a base with the slurry for a sheet.

That is, the coating film is formed on the base with the slurry for a sheet by a dipping method, a spin-coating method, a spray coating method, a blade method, or any other method. For the application of the slurry for a sheet, an application device, such as a spin coater, a slit coater, a die coater, or a blade coater, can be used. These devices can be used to uniformly form a coating film having a predetermined thickness on the base.

As the base, copper foil or a PET film described below is commonly used, but the base is not limited thereto.

<Drying Step>

The coating film formed by applying the slurry for a sheet is usually dried at a temperature of 10° C. to 150° C., preferably 25° C. to 120° C., more preferably 30° C. to 110° C. for removing the solvent and a low-molecular-weight component.

When the drying temperature is lower than or equal to the upper limit described above, the curing of the thermosetting resin in the slurry is suppressed, so that the resin tends to flow in the subsequent pressing step to easily eliminate voids. When the drying temperature is higher than or equal to the lower limit described above, the solvent can be effectively removed.

The drying time is usually 5 minutes to 10 days, preferably 10 minutes to 3 days, more preferably 20 minutes to 1 day, particularly preferably 30 minutes to 4 hours. When the drying time is more than or equal to the lower limit described above, the solvent can be sufficiently removed. This tends to suppress the formation of voids in the sheet-like cured product due to the residual solvent. When the drying time is less than or equal to the upper limit described above, the productivity tends to be improved to reduce the manufacturing costs.

<Pressing Step>

After the drying step, a pressing step is desirably performed for the purposes of, for example, bonding the inorganic filler particles together to form heat paths, eliminating voids and gaps in the sheet, and improving the adhesion to the base. The pressing step is desirably performed by applying a weight of 10 kgf/cm² or more to the dry film on the base. The weight is preferably 20 kgf/cm² or more, more preferably 50 kgf/cm² or more, and preferably 2,000 kgf/cm² or less, more preferably 1,000 kgf/cm², even more preferably 800 kgf/cm² or less. When the weight during the pressing is less than or equal to the upper limit described above, the secondary particles of the inorganic filler are not broken, and it is possible to form the sheet having a high thermal conductivity with no voids or the like in the sheet. When the weight during the pressing is more than or equal to the lower limit described above, the inorganic filler particles are in good contact with each other to easily form thermal conduction paths, so that it is possible to form the sheet having a high thermal conductivity.

In the pressing step, the dry film on the base is desirably heated at 25° C. or higher. This heating temperature is preferably 40° C. or higher, more preferably 50° C. or higher, even more preferably 60° C. or higher, and preferably 300° C. or lower, more preferably 250° C. or lower, even more preferably 200° C. or lower, particularly preferably 180° C. or lower. When the pressing step is performed within this temperature range, the melt viscosity of the resin in the coating film can be reduced to eliminate voids and gaps in the sheet. When the heating temperature is lower than or equal to the upper limit described above, the organic components are not decomposed, and the residual solvent is not vaporized to cause the formation of voids, which are preferred.

The time in the pressing step is usually 30 seconds or more, preferably 1 minute or more, more preferably 3 minutes or more, even more preferably 5 minutes or more, and preferably 4 hours or less, more preferably 2 hours or less, even more preferably 1 hour or less, particularly preferably 45 minutes or less. When the pressing time is less than or equal to the upper limit described above, the manufacturing time of the sheet-like cured product can be controlled, so that the manufacturing costs tend to be reduced. When the pressing time is more than or equal to the lower limit described above, gaps and voids in the sheet-like cured product can be sufficiently eliminated, so that the heat transfer performance and the withstand voltage characteristics tend to be improved.

<Curing Step>

The curing step for completely performing the curing reaction may be performed under pressure or without pressure. When the curing step is performed under pressure, it is desirable to use the same conditions as the pressing step described above for the same reasons. The pressing step and the curing step may be performed simultaneously.

In the sheet-forming process including the pressing step and the curing step, in particular, pressing and curing are preferably performed with the weight applied within the above range.

The thickness of the heat dissipation sheet of the present invention, which is the sheet-like cured product formed in this way, is not particularly limited, but is preferably 50 μm or more, more preferably 100 μm or more, and preferably 400 μm or less, more preferably 300 μm or less. When the thickness of the heat dissipation sheet is more than or equal to the lower limit described above, good withstand voltage characteristics are provided, so that the dielectric breakdown voltage tends to be improved. When the thickness of the heat dissipation sheet is less than or equal to the upper limit described above, miniaturization and thinning of the device can be achieved, so that the thermal resistance of the resulting heat dissipation sheet tends to be reduced.

[Composite Formed Product]

The heat dissipation sheet of the present invention can be used in the form of a composite formed product in which the heat dissipation sheet of the present invention and a metal portion are integrally laminated. In this case, the metal portion may be provided on only one surface of the heat dissipation sheet of the present invention or on two or more surfaces. For example, the composite formed product may include the metal portion provided on only one of the surfaces of the heat dissipation sheet of the present invention or may include the metal portions provided on both surfaces. The metal portion may be patterned.

The composite formed product can be manufactured by using the metal portion as the base described above and forming a sheet-like product composed of the composition of the present invention on the base according to the method described above.

The composite formed product can also be manufactured by peeling the sheet-like product formed on a different base from the metal portion from the base and then pressing the sheet-like product under heat onto a metal member to be used as the metal portion.

In this case, the composite formed product may be manufactured as follows: The sheet-like product composed of the composition of the present invention is formed in the same way as above, except that the composition is applied to a base composed of, for example, PET that may be treated with a release agent. Then this sheet-like product is peeled from the base. The sheet-like product is placed on another metal plate or interposed between two metal plates and pressed into a single piece.

As the metal plate, a metal plate that is composed of, for example, copper, aluminum, or a metal coated with nickel by plating and that has a thickness of about 10 to about 10,000 μm can be used. The surface of the metal plate may be physically roughened or chemically treated with, for example, a surface treatment agent. These treatments are more preferably performed in view of the adhesion between the resin composition and the metal plate.

[Semiconductor Device]

A semiconductor device of the present invention includes the heat dissipation sheet of the present invention mounted as a heat dissipation substrate and can achieve high output and high density with high reliability due to its heat dissipation effect and withstand voltage characteristics resulting from its high thermal conductivity. In the semiconductor device, as members, such as aluminum wiring, a sealant, a packaging material, a heatsink, a thermal paste, and a solder, other than the heat dissipation sheet of the present invention, conventionally known members can be appropriately used.

EXAMPLES

While the present invention will be described in more detail below by examples, the present invention is not limited to these examples as long as it does not depart from the gist thereof.

The values of various conditions and evaluation results in the following examples indicate a preferred range of the present invention as well as a preferred range in the embodiments of the present invention. The preferred range of the present invention can be determined by taking into consideration the preferred range in the above-mentioned embodiments and the range indicated by the values in the following examples or the combination of values among the examples.

[Measurement Conditions]

The various characteristics and physical properties in the following examples and comparative examples were measured by the following methods.

<Volume-Average Particle Size ($D_{50}$) of Agglomerated BN Powder>

Using "Morphologi" available from Malvern, $D_{50}$ (μm) of an agglomerated BN powder was measured.

<Tap Density of Agglomerated BN Powder>

A sample that had been fired by heating was subjected to air classification to prepare a powder sample having a volume-average particle size of less than 100 μm. This sample was placed in a 10-ml graduated cylinder and manually tapped until the sample volume was constant. The tap density was calculated by dividing the weight of the sample by the volume after tapping. The above method was performed by a method according to JIS R1628, except for the use of the 10-ml graduated cylinder.

<Interparticle Void Volume of Agglomerated BN Powder and Intraparticle Voidage of Agglomerated BN Particles>

These were determined from mercury intrusion measurement with a mercury porosimeter. A sample was subjected to depressurization treatment under reduced pressure (50 μmHg or less) for 10 minutes, and then the powder density and the total pore volume were determined with AutoPore IV available from Micromeritics Instruments Corporation. Additionally, a mercury intrusion-extrusion curve was measured. Assuming that the pores were cylindrical, the pore volume of a region with a pore size of 2.0 μm or more (threshold size) was calculated as the interparticle void volume.

The intraparticle pore volume was determined by subtracting the interparticle void volume from the total pore volume. The percentage of the intraparticle pore volume with respect to the powder volume (1/powder density) was defined as the intraparticle voidage.

The mercury intrusion measurement was performed by a method according to JIS R1655 with a surface tension of BN of 485 dyn/cm², a contact angle of 140°, and a measurement temperature of 23° C. to 26° C.

<Compressive Fracture strength of Agglomerated BN Powder>

The compressive fracture strength was measured at room temperature (20° C. to 30° C.) with an MCT-510 micro compression testing machine available from Shimadzu Corporation at a test force of 98 mN and a loading rate of 4.84 mN/sec using a top compression indenter having a flat surface with a diameter of 100 μm. One agglomerated BN particle having a particle size of about 50 μm was selected. The test was performed five times. The compressive fracture strength is determined by the average of the five measurement results. The fracture strength was calculated from the following formula:

$$Cs = 2.48/\pi d^2$$

where Cs: compressive fracture strength (MPa),
P: fracture test force (N), and
d: particle size (mm).

<Thermal Conductivity of Sheet-Like Formed Product in Thickness Direction>

The thermal conductivity of the heat dissipation sheet was measured by measuring the thermal resistance of four sheets having different thicknesses using the following equipment and conditions and then measuring the thermal conductivity using the steady-state method from the slope expressed by the thermal resistance against the thickness of the sheet (in accordance with ASTM $D_{5470}$).

(1) Thickness: Thickness (μm) at a pressing pressure of 3,400 kPa with T3Ster-DynTIM available from Mentor Graphics.
(2) Measurement area: The area (cm²) of a portion that transfers heat with T3Ster-DynTIM available from Mentor Graphics.
(3) Thermal resistance: Thermal resistance (K/W) at pressing pressure of 3,400 kPa with T3Ster-DynTIM available from Mentor Graphics.
(4) Thermal conductivity: Thermal resistances of four sheets having different thicknesses were measured, and the thermal conductivity (W/m·K) was calculated from the following equation.

Thermal conductivity (W/m·K)=1/((slope(thermal resistance/thickness): K/(W·μm))×(area: cm²))× $10^{-2}$         Formula:

<Withstand Voltage Characteristics of Sheet-Like Formed Product>

A voltage was applied to the sheet-like formed product having a thickness of 150 μm in insulating oil in 500 V increments per minute to determine the voltage at which the sample was destroyed.

[Production and Evaluation of Agglomerated BN Powder from BN Slurry]

Agglomerated BN particles used in the following examples and comparative examples were produced and evaluated by the following methods.

<Preparation of BN Slurry>
<<Raw Material>>

Raw-material h-BN powder (the half-width of a peak from the (002) plane obtained by powder X-ray diffraction measurement: 2θ=0.67°, total oxygen concentration=7.5% by weight, specific surface area: 116 m²/g, total pore volume: 0.754 cm³/g): 10,000 g Binder ("Takiceram M160L", available from Taki Chemical Co., Ltd., solid content concentration: 21% by weight): 11,496 g Surfactant (surfactant "ammonium lauryl sulfate", available from Kao Corporation, solid content concentration: 14% by weight): 250 g <<Preparation of Slurry>>

The raw-material h-BN powder was placed in a resin bottle, followed by the addition of a predetermined amount of the binder. A predetermined amount of the surfactant was added thereto. Then zirconia ceramic balls were added thereto. The mixture was stirred on a pot-mill rotating table for 1 hour to prepare a slurry.

<Granulation>

Granulation from the BN slurry was performed with a "P260" spray dryer, available from Preci Co., Ltd., at a disc rotation speed of 15,000 to 20,000 rpm and a drying temperature of 85° C.

<Production of Agglomerated BN Particles>

The granulated BN powder described above was placed in a graphite crucible with a lid and heated to 2,000° C. at a heating rate of 63° C./hour while introducing nitrogen gas. After the temperature reached 2,000° C., the powder was held at the same temperature for 5 hours while introducing nitrogen gas. The powder was cooled to room temperature to prepare a heat-treated sample.

A portion extending from the inner wall to a position 1 cm away from the inner wall of the graphite crucible (an upper layer, a side circumference layer, and a lower layer) in the heated sample in the graphite crucible was divided and collected as sample (A). A portion extending from the sample (A) portion to a position 1 cm inwardly away from the sample (A) portion was divided and collected as sample (B). A portion extending from the sample (B) portion to a position 1 cm inwardly away from the sample (B) portion was divided and collected as sample (C). The sample (C) was a portion extending from the inner wall of the graphite crucible (an upper layer, a side circumference layer, and a lower layer) to a position 2 cm away from the inner wall.
<Classification>

The heat-treated agglomerated BN powder portions that had been divided and collected were subjected to air classification. The air classification was performed with AC-15, available from Nisshin Engineering Inc. In each of the divided samples (A), (B), and (C), the particles were classified into particles of less than 100 µm and particles of 100 µm or more.

EVALUATION

After the classification, the tap density, the interparticle void volume, the intraparticle voidage, and the compressive fracture strength of the particles having a particle size of less than 100 µm were measured in accordance with the above-mentioned methods. In addition, the average particle size was measured. The divided portions of the samples (A), (B), and (C) were designated as sample Nos. (A)-1 and (A)-2, (B)-1, and (C)-1 to (C)-5. Table 1 presents the measurement results.

TABLE 1

| Sample No. | Average particle size $D_{50}$ (µm) | Tap density (g/ml) | Interparticle void volume (ml/g) | Intraparticle voidage (%) | Compressive fracture strength (MPa) |
|---|---|---|---|---|---|
| (C)-1 | 44 | 0.66 | 0.67 | 50 | — |
| (C)-2 | 43 | 0.69 | 0.64 | 47 | — |
| (C)-3 | 44 | 0.71 | 0.67 | 46 | — |
| (C)-4 | 41 | 0.74 | 0.60 | 47 | 6.5 |
| (C)-5 | 40 | 0.79 | 0.57 | 40 | — |
| (B)-1 | 40 | 0.80 | 0.55 | 43 | — |
| (A)-1 | 41 | 0.81 | 0.61 | 40 | 7.5 |
| (A)-2 | 39 | 0.87 | 0.51 | 36 | — |

The agglomerated BN powder of each of sample Nos. (A)-1 and (A)-2, (B)-1, and (C)-1 to (C)-5 was confirmed to have a card-house structure by SEM observation.

[Production and Evaluation of Sheet-Like Formed Product]

In the examples and comparative examples described below, agglomerated BN powder-containing resin compositions were prepared by the following method using the respective agglomerated BN powders of the above-obtained (A)-1 and (A)-2, (B)-1, and (C)-1 to (C)-5, and sheet-like formed products were produced.

<Preparation of Agglomerated BN Powder-Containing Resin Composition>

The raw materials used were described below.
<Thermosetting Resin Component>
Resin component 1: Specific epoxy resin having structure (2) ($R^3$=structure (4)) and structure (3) ($R^4$, $R^5$, $R^6$, and $R^7$=methyl groups) produced in accordance with a method for manufacturing an epoxy resin disclosed in an example of JP2006-176658A
  Weight-average molecular weight in terms of polystyrene: 30,000
  Epoxy equivalent: 9,000 g/eq
Resin component 2: Bisphenol F-type solid epoxy resin available from Mitsubishi Chemical Corporation
  Weight-average molecular weight in terms of polystyrene: 60,000

Resin component 3: Bisphenol A-type liquid epoxy resin available from Mitsubishi Chemical Corporation
Resin component 4: multifunctional epoxy resin containing a structure having four or more glycidyl groups per molecule, available from Nagase ChemteX Corporation
Resin component 5: Hydrogenated bisphenol A-type liquid epoxy resin available from Mitsubishi Chemical Corporation
Resin component 6: p-Aminophenol-type liquid epoxy resin available from Mitsubishi Chemical Corporation
<Curing Agent Component>
Curing agent 1: "MEH-8000H" available from Meiwa Plastic Industries, Ltd.
  Phenolic resin-based curing agent
<Curing Catalyst Component>
Curing catalyst 1: "2E4MZ-A" available from Shikoku Chemicals Corporation
  2,4-Diamino-6-[2'-ethyl-4'-methylimidazolyl-(17')]-ethyl-s-triazine
  (a compound having a triazine ring as a nitrogen atom-containing heterocyclic structure)
  Molecular weight: 247
Curing catalyst 2: "C11Z-CN" available from Shikoku Chemicals Corporation
  1-Cyanoethyl-2-undecylimidazole
  Molecular weight: 275
<Inorganic Filler Component>
Inorganic filler 1: Agglomerated BN powders (C)-1 to (C)-5
Inorganic filler 2: Agglomerated BN powder (B)-1
Inorganic filler 3: Agglomerated BN powders (A)-1 and (A)-2
Inorganic filler 4: Spherical alumina particles available from Admatechs Company Limited
  New Mohs hardness: 9
  Volume-average particle size: 6.5 µm
  Thermal conductivity: 20 to 30 W/m·K Example 1

A mixture was prepared with a planetary mixer so as to contain resin component 1: 7.02% by weight, resin component 3: 7.02% by weight, resin component 4: 6.67% by weight, curing agent 1: 7.37% by weight, curing catalyst 1: 0.42% by weight, inorganic filler 1: 51.14% by weight, and inorganic filler 4: 20.35% by weight. When the above-mentioned mixture was prepared, 18.6% by weight of methyl ethyl ketone and 18.6% by weight of cyclohexanone were used in such a manner that the above-mentioned mixture accounted for 62.8% by weight (solid content concentration) of a slurry for application.

The resulting slurry for application (slurry for a sheet) was applied to a PET base by a doctor blade method, dried by heating at 60° C. for 120 minutes, and pressed at 42° C. and 1,500 kgf/cm² for 10 minutes to produce a sheet-like formed product having a thickness of 150 μm. The total amount of methyl ethyl ketone and cyclohexanone contained in the sheet-like formed product was 1% or less by weight.

The thermal conductivity and the withstand voltage characteristics of the resulting sheet-like formed product were measured, and Table 2 presents the results.

Examples 2 to 6 and Comparative Examples 1 and 2

Sheet-like formed products having compositions given in Table 2 were produced in accordance with the method of Example 1. Their evaluations were performed. Table 2 presents the results.

TABLE 2

| | Composition of Agglomerated BN powder-containing resin composition (% by weight) *1 | | | | | | | | |
|---|---|---|---|---|---|---|---|---|---|
| | Inorganic filler 1 | | Inorganic filler 2 | | Inorganic filler 3 | | Inorganic filler 4 | Resin component 1 | Resin component 2 |
| | Sample No. | Amount added | Sample No. | Amount added | Sample No. | Amount added | Amount added | | |
| Example 1 | (C)-1 | 51.14 | | | | | 20.35 | 7.02 | |
| Example 2 | (C)-2 | 51.14 | | | | | 20.35 | | 8.76 |
| Example 3 | (C)-3 | 51.14 | | | | | 20.35 | 7.02 | |
| Example 4 | (C)-4 | 51.14 | | | | | 20.35 | 7.02 | |
| Example 5 | (C)-5 | 51.14 | | | | | 20.35 | 7.02 | |
| Example 6 | | | (B)-1 | 51.14 | | | 20.35 | 7.02 | |
| Comparative example 1 | | | | | (A)-1 | 51.14 | 20.35 | 7.02 | |
| Comparative example 2 | | | | | (A)-2 | 51.14 | 20.35 | 7.02 | |

| | Composition of Agglomerated BN powder-containing resin composition (% by weight) *1 | | | | | | | Thermal conductivity (W/mk) | Withstand voltage (kV/mm) |
|---|---|---|---|---|---|---|---|---|---|
| | Resin component 3 | Resin component 4 | Resin component 5 | Resin component 6 | Curing agent 1 | Curing catalyst 1 | Curing catalyst 2 | | |
| Example 1 | 7.02 | 6.67 | | | 7.37 | 0.42 | | 15.7 | 60 |
| Example 2 | | | 10.95 | 2.63 | 5.74 | | 0.42 | 14.8 | 51 |
| Example 3 | 7.02 | 6.67 | | | 7.37 | 0.42 | | 15.2 | 48 |
| Example 4 | 7.02 | 6.67 | | | 7.37 | 0.42 | | 14.9 | 51 |
| Example 5 | 7.02 | 6.67 | | | 7.37 | 0.42 | | 13.6 | 51 |
| Example 6 | 7.02 | 6.67 | | | 7.37 | 0.42 | | 12.9 | 42 |
| Comparative example 1 | 7.02 | 6.67 | | | 7.37 | 0.42 | | 13.8 | 24 |
| Comparative example 2 | 7.02 | 6.67 | | | 7.37 | 0.42 | | 10.4 | 46 |

*Excluding organic solvent

Table 2 indicates that the use of the agglomerated BN powder of the present invention having a tap density and an interparticle void volume within the specific ranges enables the production of the heat dissipation sheet excellent in thermal conductivity and withstand voltage characteristics.

While the present invention has been described in detail using a specific embodiment, it should be apparent to those skilled in the art that various modifications can be made without departing from the spirit and scope of the present invention.

The present application is based on Japanese Patent Application No. 2019-034518 filed on Feb. 27, 2019, which is incorporated herein by reference in its entirety.

The invention claimed is:

1. An agglomerated boron nitride powder, having:
   a tap density in a range of from 0.65 to less than 0.8 g/mL; and
   an interparticle void volume of 0.5 mL/g or more.

2. The powder of claim 1, wherein the interparticle void volume is in a range of from 0.5 to 0.9 mL/g.

3. The powder of claim 1, having an average particle size in a range of from 20 to 200 μm.

4. The powder of claim 1, wherein agglomerated BN particles contained in the agglomerated boron nitride powder have an intraparticle voidage in a range of from 40 to 60%.

5. The powder of claim 1, having a card-house structure.

6. A heat dissipation sheet, comprising:
   the agglomerated boron nitride powder of claim 1.

7. A semiconductor device, comprising:
   the heat dissipation sheet of claim 6.

8. The powder of claim 2, having an average particle size in a range of from 20 to 200 μm.

9. The powder of claim 1, having a compressive fracture strength of 10 MPa or less.

10. The powder of claim 1, having a compressive fracture strength in a range of from 1 to 10 MPa.

11. The powder of claim 1, wherein the interparticle void volume is in a range of from 0.55 to 0.8 mL/g.

12. The powder of claim 1, wherein the interparticle void volume is in a range of from 0.58 to 0.8 mL/g.

13. The powder of claim 1, having an average particle size is in a range of from 25 to 150 μm.

14. The powder of claim 1, having an average particle size is in a range of from 30 to 100 μm.

15. The powder of claim 1, having an average particle size in a range of from 20 to 200 μm,
wherein the interparticle void volume is in a range of from 0.5 to 0.9 mL/g, and
wherein agglomerated BN particles contained in the agglomerated boron nitride powder have an intraparticle voidage in a range of from 40 to 60%.

16. The powder of claim 1, having an average circularity of 0.8 or more.

17. The powder of claim 1, having an average particle size in a range of from 25 to 150 μm and an average circularity of 0.8 or more,
wherein the interparticle void volume is in a range of from 0.5 to 0.9 mL/g, and
wherein agglomerated BN particles contained in the agglomerated boron nitride powder have an intraparticle voidage in a range of from 40 to 60%.

18. The powder of claim 1, having an average particle size in a range of from 25 to 150 μm and an average circularity of 0.85 or more,
wherein the interparticle void volume is in a range of from 0.5 to 0.9 mL/g, and
wherein agglomerated BN particles contained in the agglomerated boron nitride powder have an intraparticle voidage in a range of from 45 to 55%.

19. The powder of claim 1, having an average particle size in a range of from 25 to 150 μm and an average circularity of 0.85 or more,
wherein the interparticle void volume is in a range of from 0.55 to 0.8 mL/g, and
wherein agglomerated BN particles contained in the agglomerated boron nitride powder have an intraparticle voidage in a range of from 45 to 55%.

20. The powder of claim 1, having an average particle size in a range of from 25 to 150 μm and an average circularity of 0.85 or more,
wherein the interparticle void volume is in a range of from 0.55 to 0.8 mL/g,
wherein agglomerated BN particles contained in the agglomerated boron nitride powder have an intraparticle voidage in a range of from 45 to 55%, and
wherein the tap density in a range of from 0.65 to less than 0.78 g/mL.

\* \* \* \* \*